(12) United States Patent
Koka et al.

(10) Patent No.: US 9,515,079 B2
(45) Date of Patent: Dec. 6, 2016

(54) THREE DIMENSIONAL MEMORY DEVICE WITH BLOCKING DIELECTRIC HAVING ENHANCED PROTECTION AGAINST FLUORINE ATTACK

(71) Applicant: SanDisk Technologies, Inc., Plano, TX (US)

(72) Inventors: Sateesh Koka, Milpitas, CA (US); Raghuveer S. Makala, Campbell, CA (US); Somesh Peri, San Jose, CA (US); Rahul Sharangpani, Fremont, CA (US); Yao-Sheng Lee, Tampa, FL (US); George Matamis, Danville, CA (US); Wei Zhao, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/751,922

(22) Filed: Jun. 26, 2015

(65) Prior Publication Data
US 2016/0172366 A1    Jun. 16, 2016

Related U.S. Application Data

(63) Continuation-in-part of application No. 14/571,824, filed on Dec. 16, 2014.

(51) Int. Cl.
*H01L 27/115* (2006.01)
*H01L 21/223* (2006.01)
(Continued)

(52) U.S. Cl.
CPC ... *H01L 27/11524* (2013.01); *H01L 21/02164* (2013.01); *H01L 21/02178* (2013.01); *H01L 21/02332* (2013.01); *H01L 21/02356* (2013.01); *H01L 21/2236* (2013.01);
(Continued)

(58) Field of Classification Search
None
See application file for complete search history.

(56) References Cited

U.S. PATENT DOCUMENTS

| 5,915,167 A | 6/1999 | Leedy |
| 8,709,894 B2* | 4/2014 | Lee ................. H01L 29/66833 257/390 |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Minh-Loan Tran
(74) *Attorney, Agent, or Firm* — The Marbury Law Group PLLC

(57) ABSTRACT

Blocking dielectric structures and/or thicker barrier metal films for preventing or reducing fluorine diffusion are provided. A blocking dielectric layer can be formed as an outer layer of a memory film in a memory stack structure extending through electrically insulating layers and sacrificial material layers. After formation of backside recesses by removal of the sacrificial material layers, dopants can be introduced into physically exposed portions of the blocking dielectric layer, for example, by plasma treatment or thermal treatment, to form silicon oxynitride regions which can reduce or prevent fluorine diffusion. Alternatively or additionally, a set of metal oxide blocking dielectric material portions can be formed in the backside recesses to retard or prevent fluorine diffusion. To minimize adverse impact on the electrically conductive layers formed in the backside recesses, the blocking dielectric material portions can be laterally recessed from a trench employed to form the backside recesses.

13 Claims, 36 Drawing Sheets

(51) Int. Cl.
  *H01L 21/02* (2006.01)
  *H01L 29/788* (2006.01)
  *H01L 29/792* (2006.01)
(52) U.S. Cl.
  CPC .... *H01L 27/1157* (2013.01); *H01L 27/11556* (2013.01); *H01L 27/11565* (2013.01); *H01L 27/11582* (2013.01); *H01L 29/7883* (2013.01); *H01L 29/792* (2013.01)

(56) References Cited

U.S. PATENT DOCUMENTS

| | | | |
|---|---|---|---|
| 8,987,805 B2* | 3/2015 | Nam | H01L 29/7926 257/324 |
| 9,023,719 B2 | 5/2015 | Pachamuthu et al. | |
| 2012/0001252 A1 | 1/2012 | Alsmeier et al. | |
| 2012/0299076 A1* | 11/2012 | Yoo | H01L 29/66833 257/314 |
| 2014/0054676 A1 | 2/2014 | Nam et al. | |
| 2014/0353738 A1* | 12/2014 | Makala | H01L 27/11551 257/321 |
| 2015/0008505 A1 | 1/2015 | Chien et al. | |
| 2015/0076584 A1 | 3/2015 | Pachamuthu et al. | |
| 2015/0179660 A1 | 6/2015 | Yada et al. | |
| 2015/0179662 A1 | 6/2015 | Makala et al. | |

OTHER PUBLICATIONS

Chen, R. et al., "Chemistry for Positive Pattern Transfer Using Area-Selective Atomic Layer Deposition," Advanced Materials, vol. 18, pp. 1086-1090, (2006).
Moshe, H. et al., "Atomic Layer Deposition on Self-Assembled Monolayers," Materials Science—Advanced Topics, Chapter 3, pp. 63-84, (2013).
Spencer, D. F., NNUN Workshop on Electron Beam Lithography for Nanostructure Fabrication, Presentation Titles, "Resist & Resist Processing," Cornell Nanofabrication Facility, Cornell University, Ithaca, NY, 15 pages, (Jan. 14-15, 2002).
Dumas, P. et al., "Electron-Energy-Loss Characterization of the H-Terminated Si(111) and Si(100) Surfaces Obtained by Etching in $NH_4F$," Chemical Physics Letters, vol. 181, No. 6, pp. 537-543, (1991).
Kobayashi, N. P. et al., "Two-Stage Atomic Layer Deposition of Smooth Aluminum Oxide on Hydrophobic Self-Assembled Monolayers," Engineering Letters, vol. 16, No. 2, 6 pages, (2008).
Wang, M. et al., "Self-Assembled Silane Monolayers: Fabrication with Nanoscale Uniformity," Langmuir, vol. 21, pp. 1848-4857, (2005).
Dong, W. et al., "Application of Three-Dimensionally Area-Selective Atomic Layer Deposition for Selective Coating the Vertical Surfaces of Standing Nanopillars," Scientific Reports, vol. 4, pp. 1-4, (2014).
Sung, M. M. et al., "Formation of Alkylsiloxane Self-Assembled Monolayers on $Si_3N_4$," J. Vac. Sci. Technol. A, vol. 17, No. 2, pp. 540-544, (1999).
Knez, M. et al., "Synthesis and Surface Engineering of Complex Nanostructures by Atomic Layer Deposition," Adv. Mater., vol. 19, pp. 3425-3438, (2007).
Li, M., "Modification of Silicon by Self-Assembled Monolayers for Application in Nano-Electronics and Biology," Dissertation Submitted to the Graduate School-New Brunswick, Rutgers, the State University of New Jersey for Degree of Doctor of Philosophy, 195 pages, (2007).
U.S. Appl. No. 14/319,283, filed Jun. 30, 2014, SanDisk Technologies Inc.
U.S. Appl. No. 14/456,496, filed Aug. 11, 2014, SanDisk Technologies Inc.
U.S. Appl. No. 14/456,515, filed Aug. 11, 2014, SanDisk Technologies Inc.
U.S. Appl. No. 14/468,743, filed Aug. 26, 2014, SanDisk Technologies Inc.
U.S. Appl. No. 14/539,307, filed Nov. 12, 2014, SanDisk Technologies Inc.
U.S. Appl. No. 14/571,824, filed Dec. 16, 2014, SanDisk Technologies Inc.
Invitation to Pay Additional Fees and Communication Relating to the Results of the Partial International Search for PCT/US2015/053841, 9 pages, dated Dec. 21, 2015.
International Search Report and Written Opinion of International Searching Authority for PCT/US2015/053841, 19 pages, dated Feb. 24, 2016.

* cited by examiner

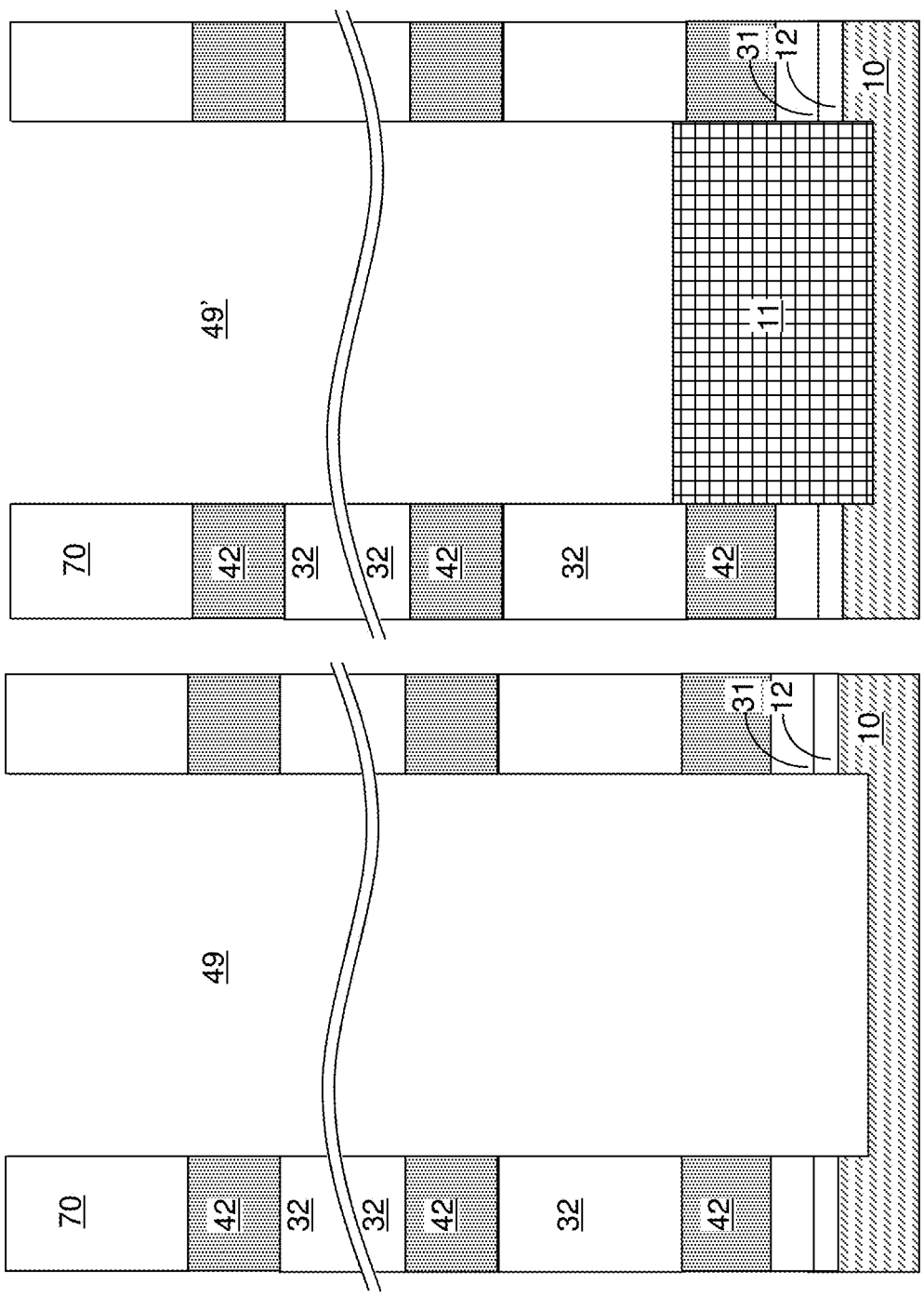

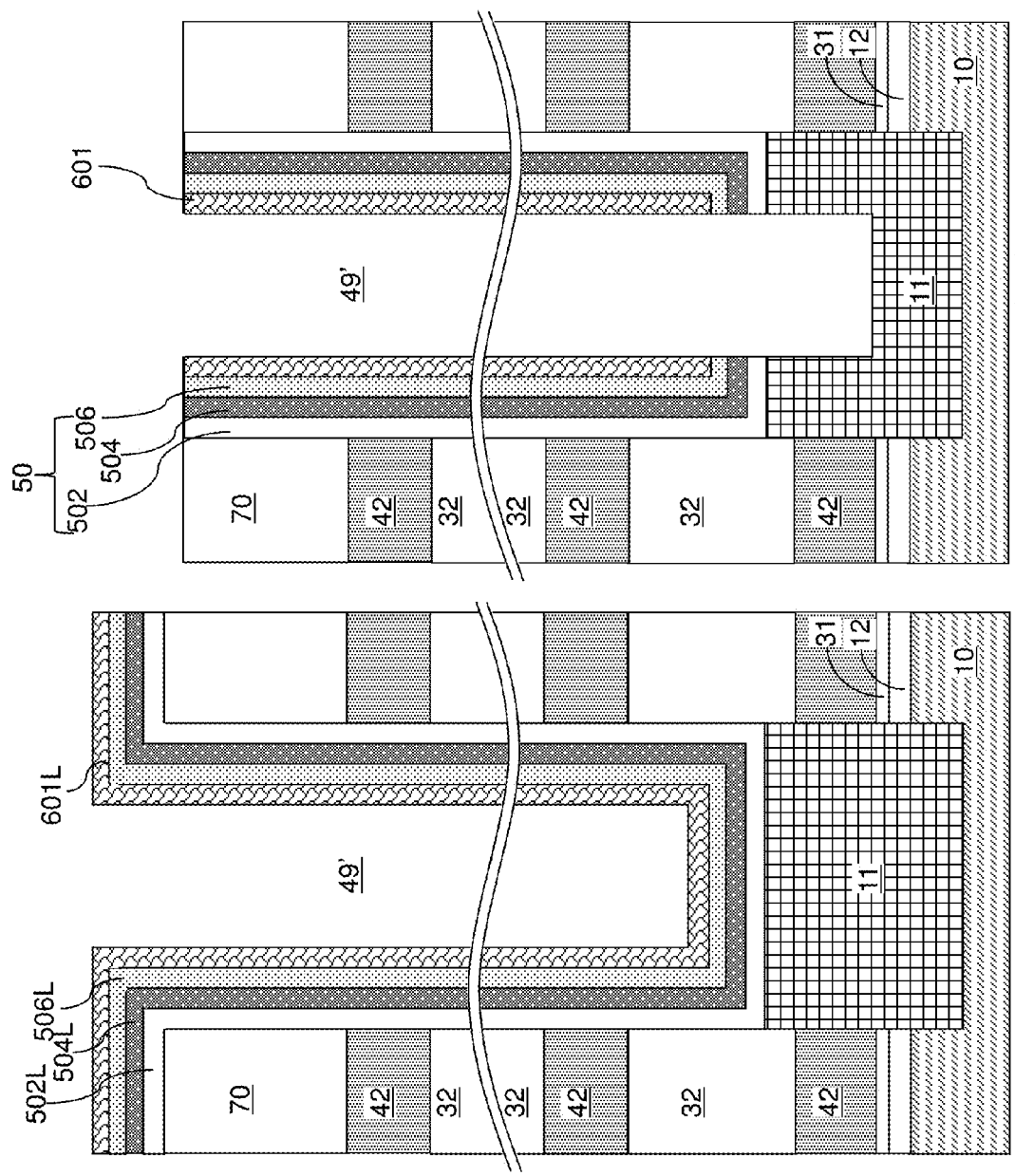

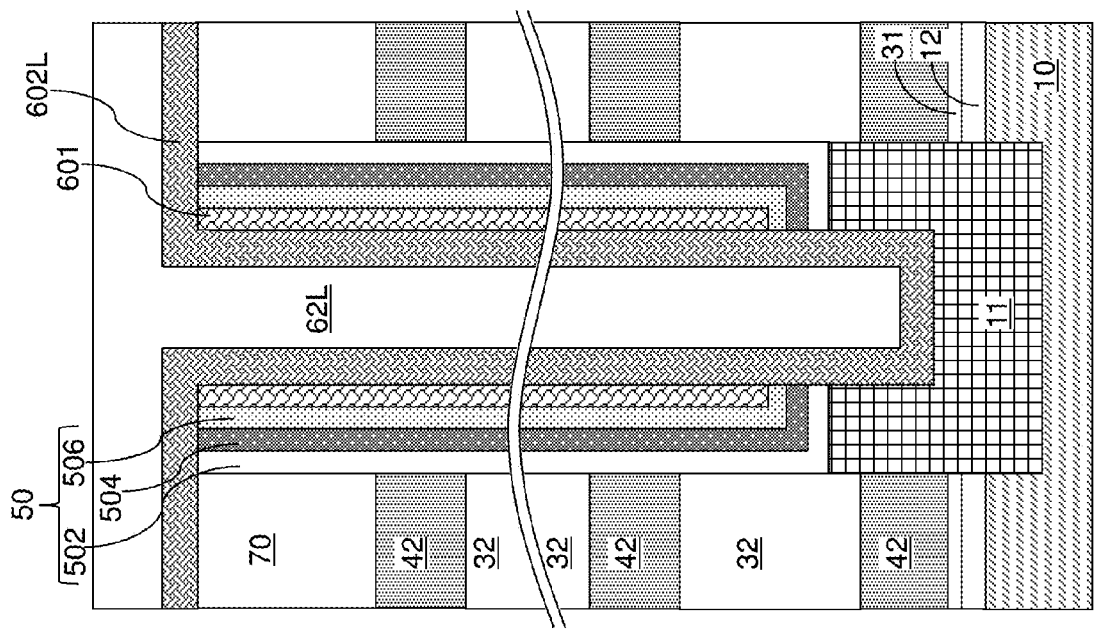
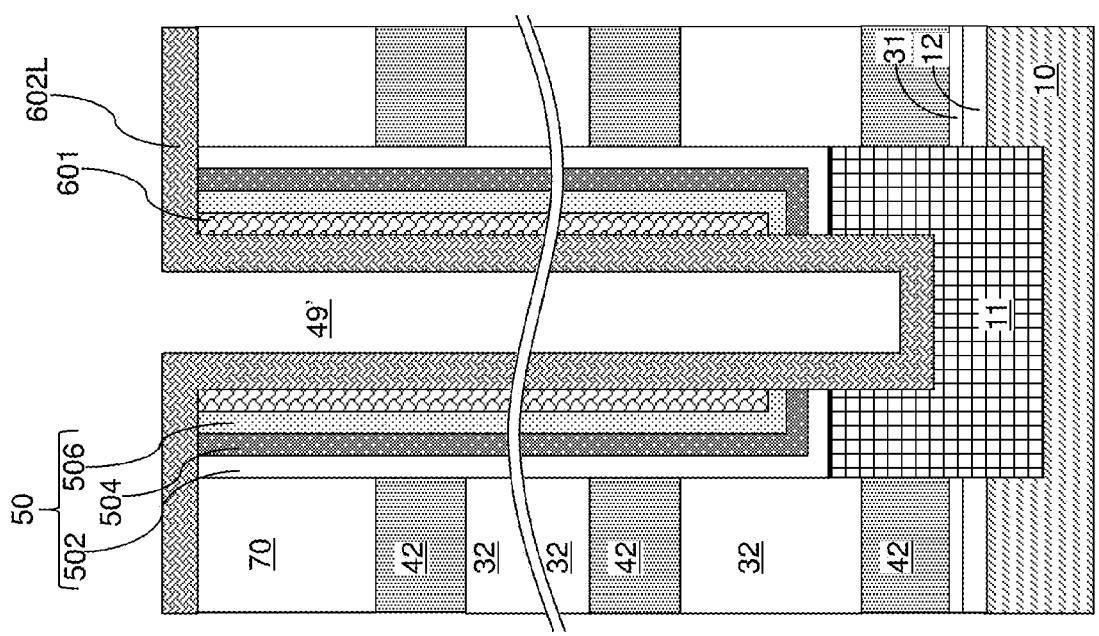

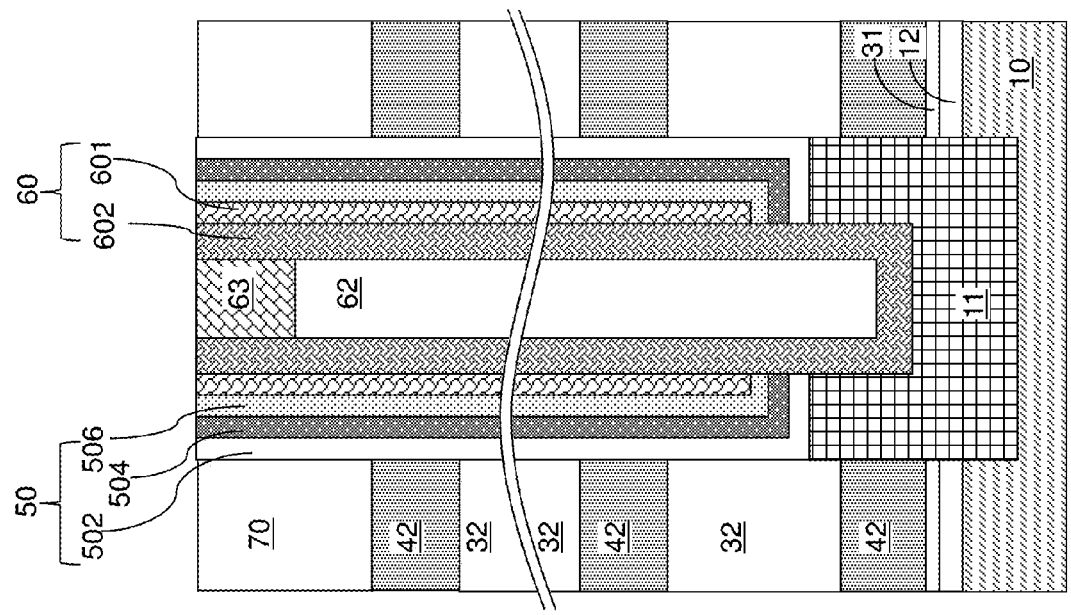
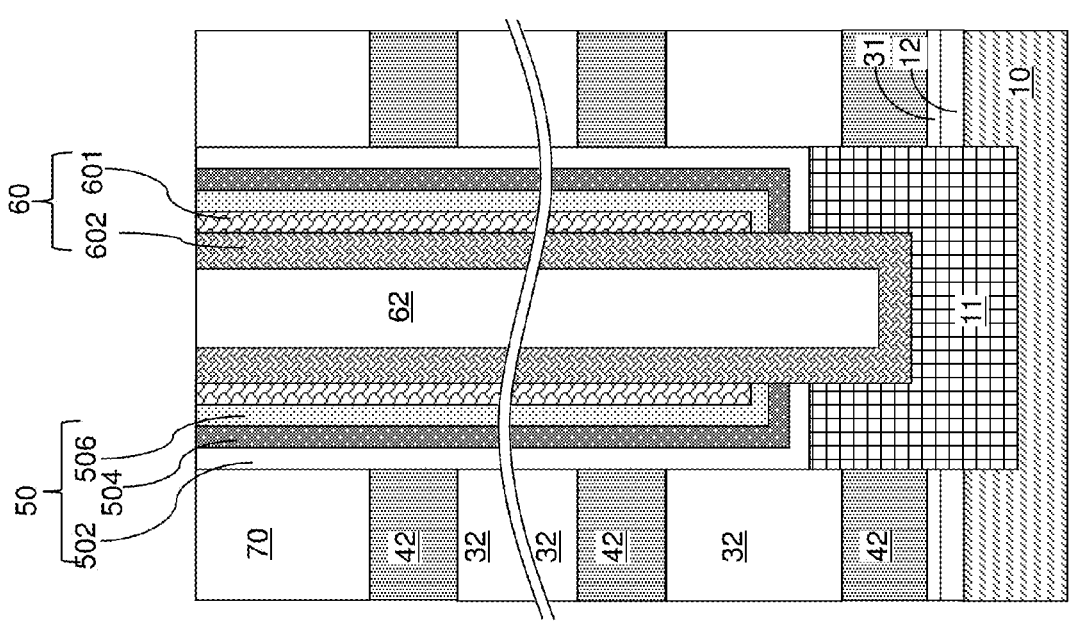

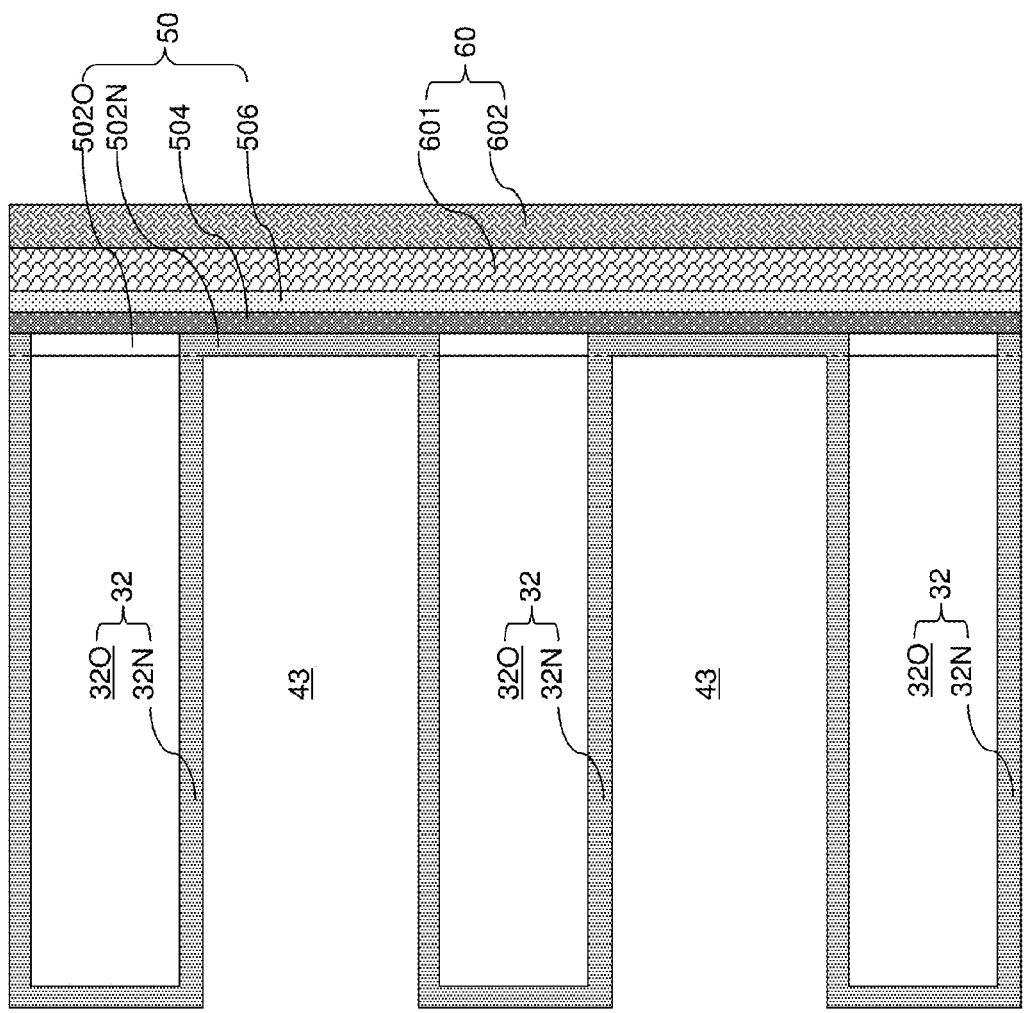

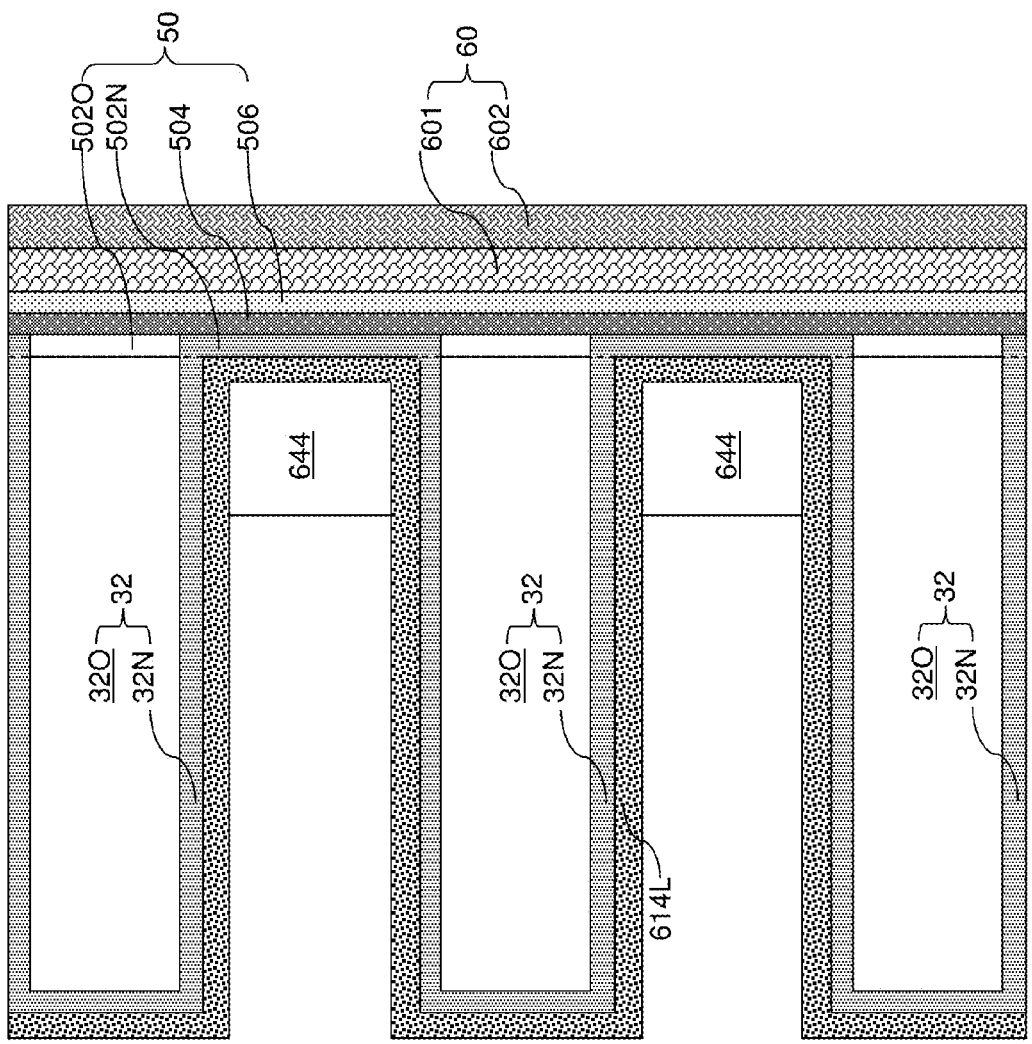

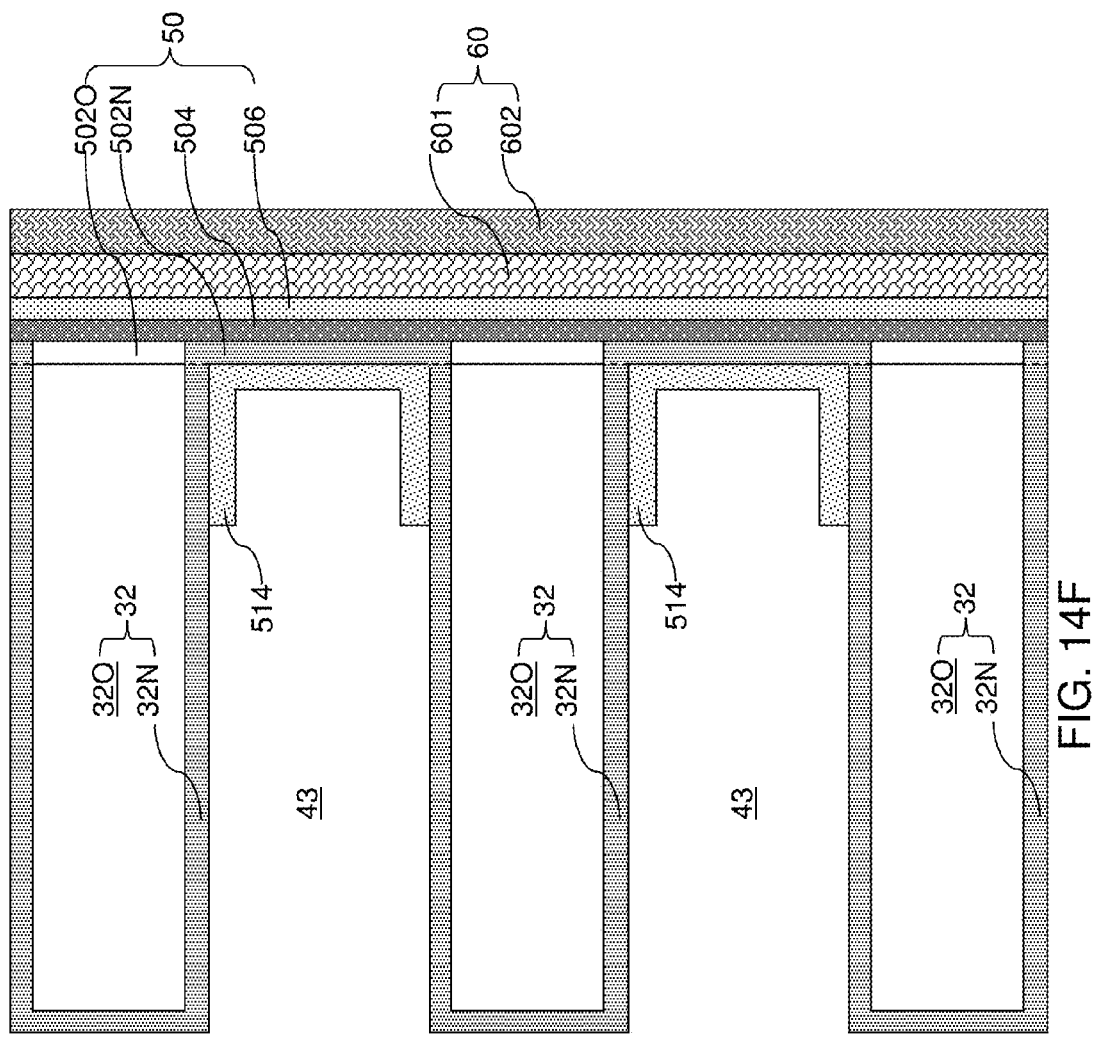

THREE DIMENSIONAL MEMORY DEVICE WITH BLOCKING DIELECTRIC HAVING ENHANCED PROTECTION AGAINST FLUORINE ATTACK

RELATED APPLICATION

The present application is a continuation-in-part (CIP) application of U.S. patent application Ser. No. 14/571,824 filed on Dec. 16, 2014, the entire contents of which is incorporated herein by reference.

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which includes a stack of alternating layers comprising insulating layers and electrically conductive layers and located over a substrate, a memory opening extending vertically through the stack, and a memory film and a semiconductor channel located within the memory opening, the memory film comprising a blocking dielectric which comprises an alternating stack of silicon oxide portions and silicon oxynitride portions.

According to another aspect of the present disclosure, a monolithic three-dimensional memory device is provided, which comprises a stack of alternating layers comprising insulating layers and electrically conductive layers and located over a substrate, a first memory opening extending vertically through the stack, a first memory film and a first semiconductor channel located within the first memory opening, and a set of metal oxide blocking dielectric material portions interposed between the first memory film and each of the electrically conductive layers. Each of the metal oxide blocking dielectric material portions in the set comprises a vertical portion contacting a sidewall of a respective electrically conductive layer, a top horizontal portion extending outward from the first memory opening and contacting only a portion of a top surface of the respective electrically conductive layer, and a bottom horizontal portion extending outward from the first memory opening and contacting only a portion of a bottom surface of the respective electrically conductive layer.

According to yet another aspect of the present disclosure, a method of forming a monolithic three-dimensional memory device is provided. A stack of alternating layers comprising first material layers and second material layers is formed over a substrate. Memory openings are formed through the stack of alternating layers. Memory stack structures are formed in the memory openings. Each memory stack structure comprises a memory film and a semiconductor channel contacting an inner sidewall of the memory film. The memory film comprises a blocking dielectric layer contacting a sidewall of a respective memory opening. A trench extending through the stack of alternating layers is formed. Backside recesses are formed by removing the second material layers selective to the first material layers. Portions of the silicon oxide blocking dielectric layer exposed in the backside recesses are doped with nitrogen to form silicon oxynitride portions in the silicon oxide blocking dielectric layer According to still another aspect of the present disclosure, a method of forming a monolithic three-dimensional memory device is provided. A stack of alternating layers comprising first material layers and second material layers is formed over a substrate. Memory openings are formed through the stack of alternating layers. Memory stack structures are formed in the memory openings. A trench extending through the stack of alternating layers is formed. Backside recesses are formed by removing the second material layers selective to the first material layers. A set of blocking dielectric material portions are formed on the memory films within regions of the backside recesses that are adjacent to the memory films. Each blocking dielectric material portion is laterally spaced from a sidewall of the trench. The backside recesses are filled within electrically conductive layers.

BRIEF DESCRIPTION OF THE DRAWINGS

FIGS. 2A-2h are sequential vertical cross-sectional views of a memory opening within the first exemplary structure during various processing steps employed to form a memory stack structure according to the first embodiment of the present disclosure.

FIGS. 7A-7D are sequential vertical cross-sectional views of a region of the first exemplary structure around two backside recesses during formation of electrically conductive layers according to the first embodiment of the present disclosure.

FIGS. 14A-14H are sequential vertical cross-sectional views of a region of a third exemplary structure around two backside recesses during formation of electrically conductive layers according a third embodiment of the present disclosure.

DETAILED DESCRIPTION

Figure 1:
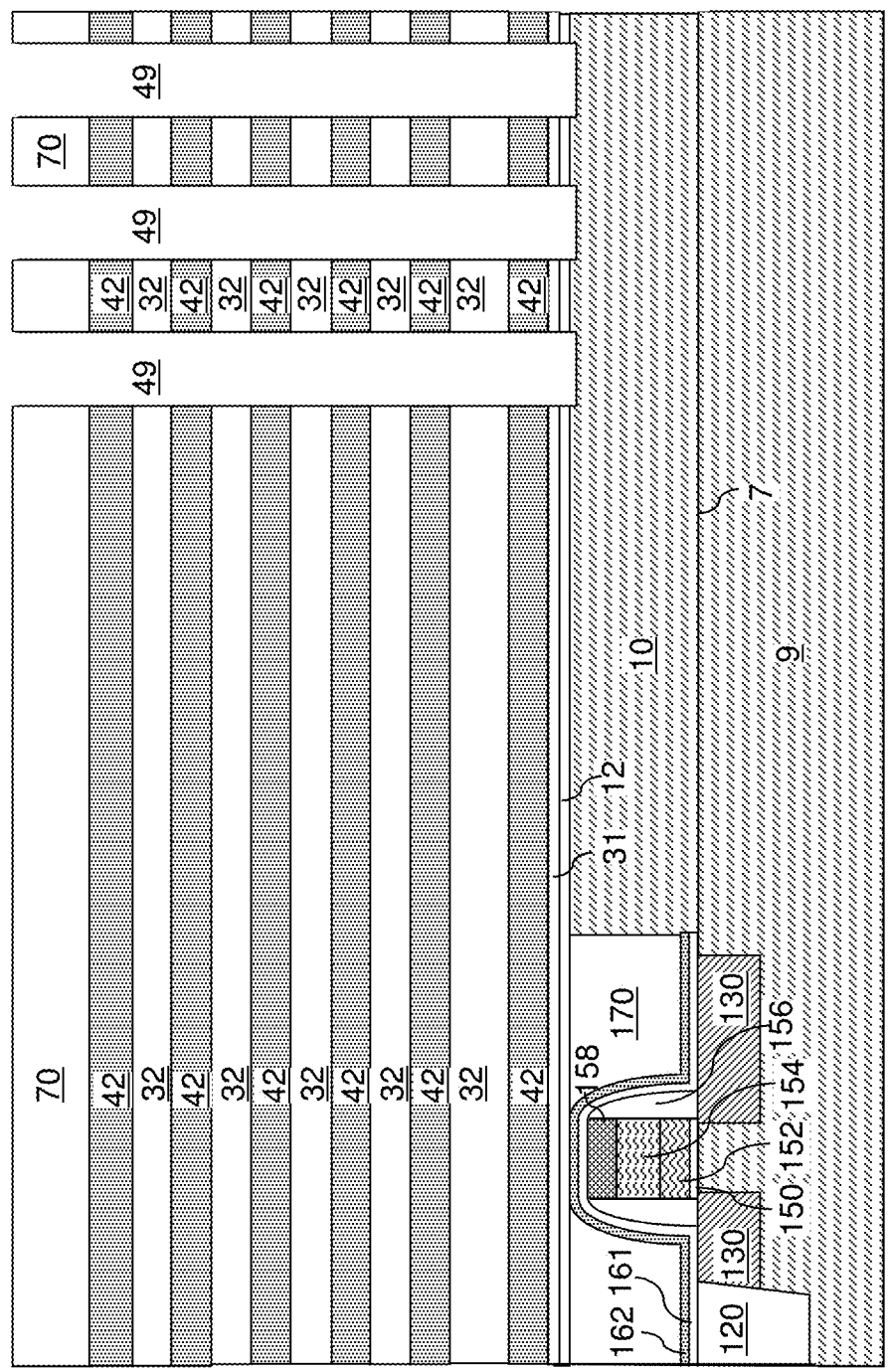
FIG. 1 is a vertical cross-sectional view of a first exemplary structure after formation of a stack including an alternating plurality of material layers and memory openings extending through the stack according to a first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to the first embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. A material is "semiconducting" if the electrical conductivity is in a range from $1.0 \times 10^{-6}$ S/cm to $1.0 \times 10^{5}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A dielectric cap layer 31 can be optionally formed. The dielectric cap layer 31 includes a dielectric material. Exemplary materials that can be employed for the dielectric cap layer 31 include, but are not limited to, silicon oxide, a dielectric metal oxide, and silicon nitride (in case the material of second material layers to be subsequently formed is not silicon nitride).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2H illustrate sequential vertical cross-sectional views of a memory opening within the first exemplary structure during formation of an exemplary memory stack structure according to a embodiment of the present disclosure. Formation of the exemplary memory stack structure can be performed within each of the memory openings 49 in the first exemplary structure illustrated in FIG. 1.

Referring to FIG. 2A, a memory opening 49 in the first exemplary structure of FIG. 1 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

Referring to FIG. 2C, a series of layers including a blocking dielectric layer 502L, a memory material layer 504L, a tunneling dielectric layer 506L, and an optional first semiconductor channel layer 601L can be sequentially deposited in the memory openings 49. The blocking dielectric layer 502L can be deposited on the sidewalls of each memory opening 49 by a conformal deposition method. The blocking dielectric layer 502L includes a dielectric material, which can be silicon oxide or a stack of silicon oxide and another dielectric material such as a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen.

The blocking dielectric layer 502L can consist of a silicon oxide layer that contacts sidewalls of each memory opening 49, or can comprise a stack of dielectric layers that include a silicon oxide layer that contacts sidewalls of each memory opening 49. The blocking dielectric layer 502L can be formed by a conformal deposition method such as low pressure chemical vapor deposition, atomic layer deposition, or a combination thereof. The thickness of the blocking dielectric layer 502L can be in a range from 1 nm to 20 nm, although lesser and greater thicknesses can also be employed. The thickness of the silicon oxide layer within the blocking dielectric layer 502L can be in a range from 1 nm to 20 nm, although lesser and greater thicknesses can also be employed.

Subsequently, the memory material layer 504L, the tunneling dielectric layer 506L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (502L, 504L, 506L, 601L).

Referring to FIG. 2D, the optional first semiconductor channel layer 601L, the tunneling dielectric layer 506L, the memory material layer 504L, the blocking dielectric layer 502L are sequentially anisotropically etched employing at least one anisotropic etch process. The portions of the first semiconductor channel layer 601L, the tunneling dielectric layer 506L, the memory material layer 504L, and the blocking dielectric layer 502L located above the top surface of the insulating cap layer 70 can be removed by the at least one anisotropic etch process. Further, the horizontal portions of the first semiconductor channel layer 601L, the tunneling dielectric layer 506L, the memory material layer 504L, and the blocking dielectric layer 502L at a bottom of each cavity 49' can be removed to form openings in remaining portions thereof. Each of the first semiconductor channel layer 601L, the tunneling dielectric layer 506L, the memory material layer 504L, and the blocking dielectric layer 502L can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the memory material layer 504L is herein referred to as a charge storage element 504. In one embodiment, the charge storage element 504 can be a contiguous layer, i.e., can be a charge storage layer. Each remaining portion of the blocking dielectric layer 502L is herein referred to as a blocking dielectric layer 502. A surface of the epitaxial channel portion 11 can be physically exposed underneath the opening through the first semiconductor channel portion 601, the tunneling dielectric 506, the charge storage element 504, and the blocking dielectric layer 502. Optionally, the physically exposed portion of the epitaxial channel portion 11 can be vertically recessed. A tunneling dielectric 506 is embedded within a charge storage element 504. The charge storage element 504 can comprise a charge trapping material or a floating gate material.

The set of the tunneling dielectric 506, the charge storage element 504, the blocking dielectric layer 502 collectively constitutes a memory film 50. In one embodiment, the first semiconductor channel portion 601, the tunneling dielectric 506, the charge storage element 504, and the blocking dielectric layer 502 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, a second semiconductor channel layer 602L can be deposited directly on the semiconductor surface of the epitaxial channel portion 11 over the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is embedded within a charge storage element 504, and laterally surrounds a portion of the semiconductor channel 60. Each adjoining set of a blocking dielectric layer 502, a charge storage element 504, and a tunneling dielectric 506 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2H, drain regions 63 can be formed by depositing a doped semiconductor material within each recessed region above the dielectric cores 62. The doped semiconductor material can be, for example, doped polysilicon formed by at least one of in-situ doping and ion implantation doping or a combination thereof. The highly doped drain regions near the drain side select gates provide a low resistive contact region for a bit line connection. Excess portions of the deposited semiconductor material can be removed from above the top surface of the insulating cap layer 70, for example, by chemical mechanical planarization (CMP) or a recess etch to form the drain regions 63.

Figure 3:
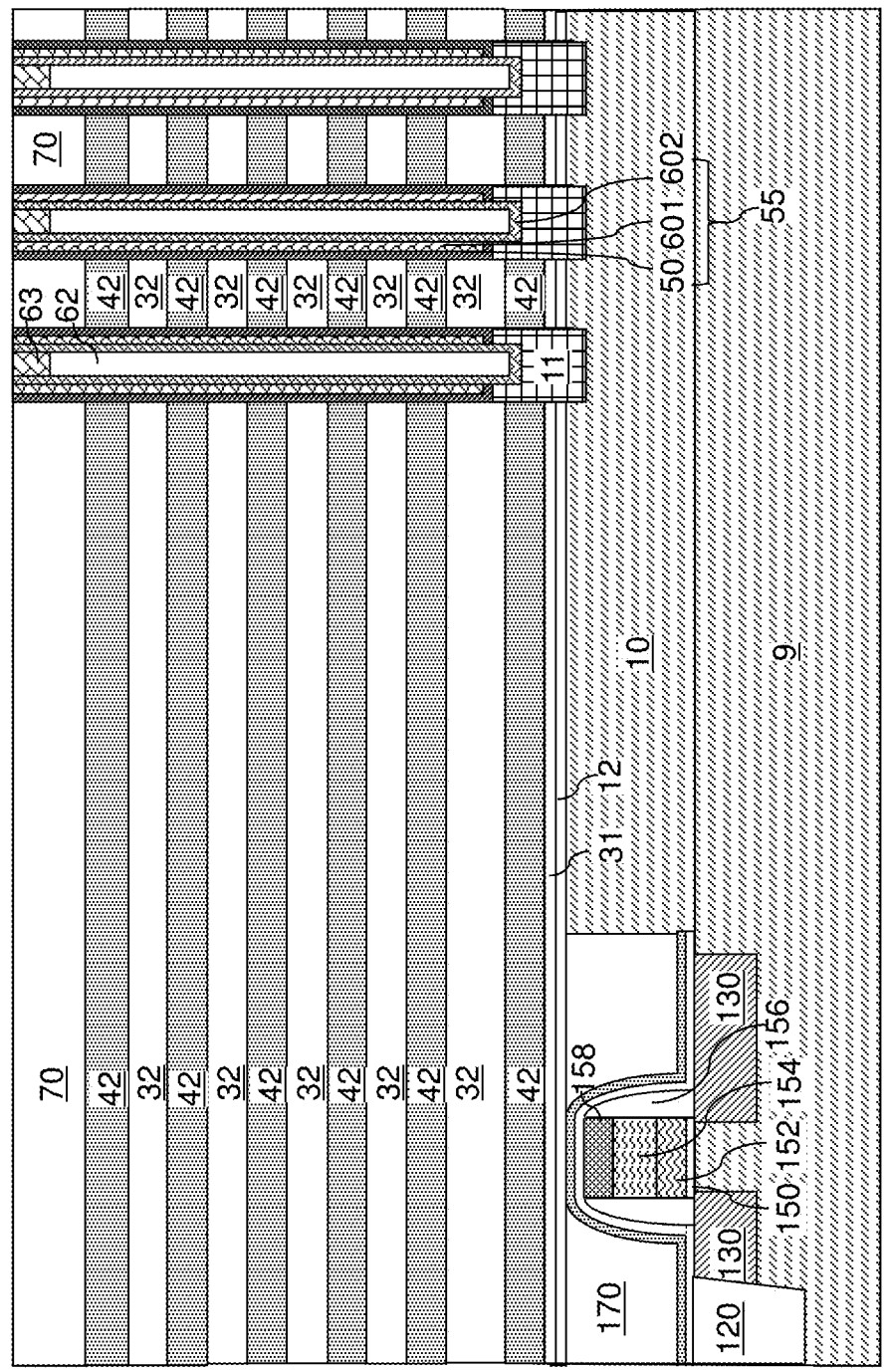
FIG. 3 is a vertical cross-sectional view of the first exemplary structure after formation of memory stack structures according to the first embodiment of the present disclosure.

The exemplary memory stack structure can be embedded into the first exemplary structure illustrated in FIG. 1. FIG. 3 illustrates the first exemplary structure that incorporates multiple instances of the exemplary memory stack structure of FIG. 2F. The first exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a blocking dielectric layer 502 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. Each memory film 50 comprises a blocking dielectric layer 502 contacting a sidewall of a respective memory opening.

Figure 4:
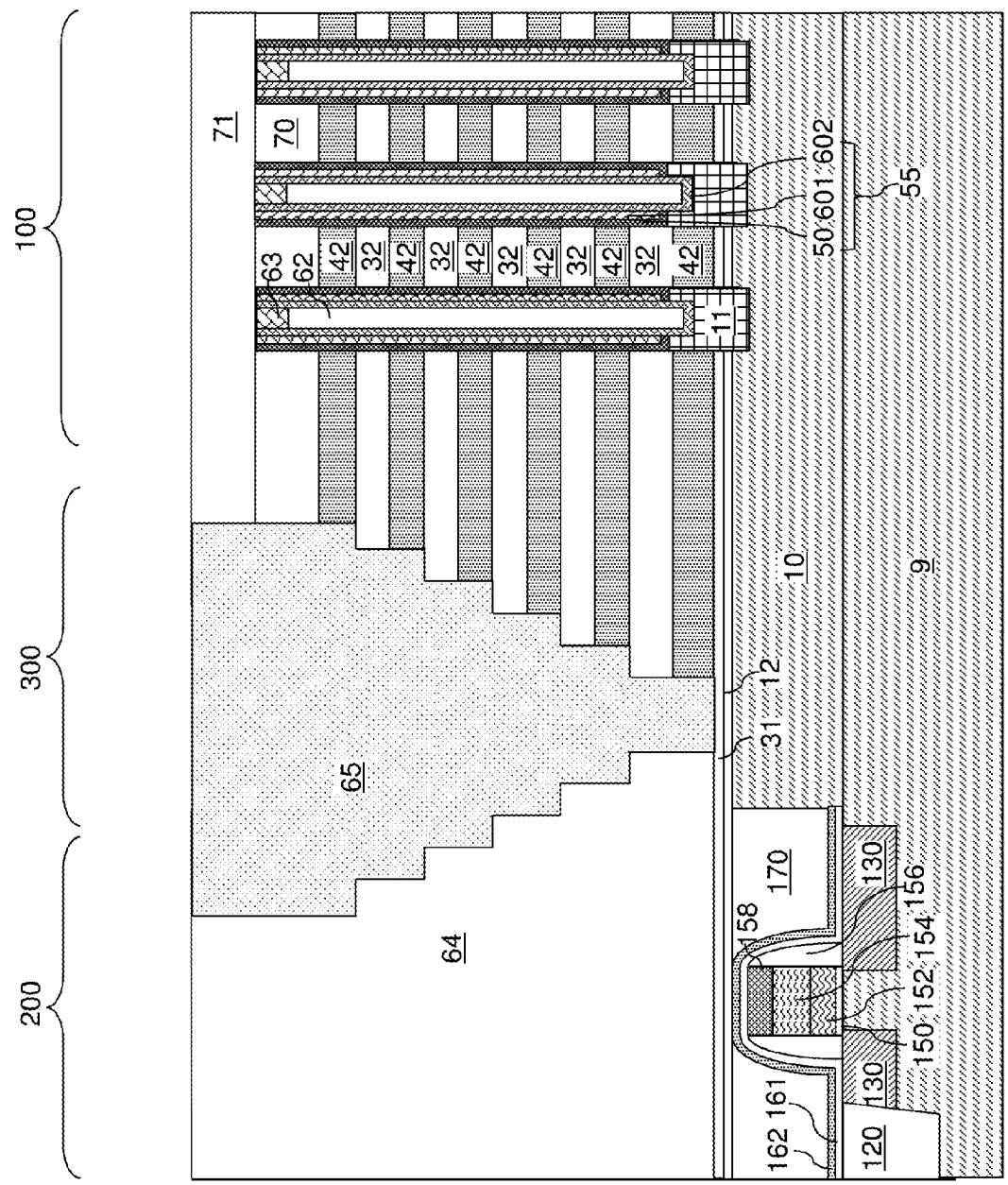
FIG. 4 is a vertical cross-sectional view of the first exemplary structure after formation of a stepped terrace and a retro-stepped dielectric material portion according to the first embodiment of the present disclosure.

Referring to FIG. 4, an optional first array contact level dielectric layer 71 can be formed over the substrate (9, 10). As an optional structure, the first array contact level dielectric layer 71 may, or may not, be formed. In case the first array contact level dielectric layer 71 is formed, the first array contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first array contact level dielectric layer 71 can be formed over a horizontal plane including the top surface of the insulating cap layer 70 and the top surfaces of the drain regions 63. The first array contact level dielectric layer 71 can be deposited by chemical vapor deposition, atomic layer deposition (ALD), spin-coating, or a combination thereof. The thickness of the first array contact level dielectric layer 71 can be in a range from 10 nm to 300 nm, although lesser and greater thicknesses can also be employed.

In one embodiment, the first array contact level dielectric layer 71 can be formed as a dielectric material layer having a uniform thickness throughout. The first array contact level dielectric layer 71 may be formed as a single dielectric material layer, or can be formed as a stack of a plurality of dielectric material layers. Alternatively, formation of the first array contact level dielectric layer 71 may be merged with formation of at least one line level dielectric layer (not shown). While the present disclosure is described employing an embodiment in which the first array contact level dielectric layer 71 is a structure separate from an optional second array contact level dielectric layer or at least one line level dielectric layer to be subsequently deposited, embodiments in which the first array contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first array contact level dielectric layer 71 by a planarization process such as chemical mechanical planarization and/or a recess etch. The top surfaces of the first array contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first array contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
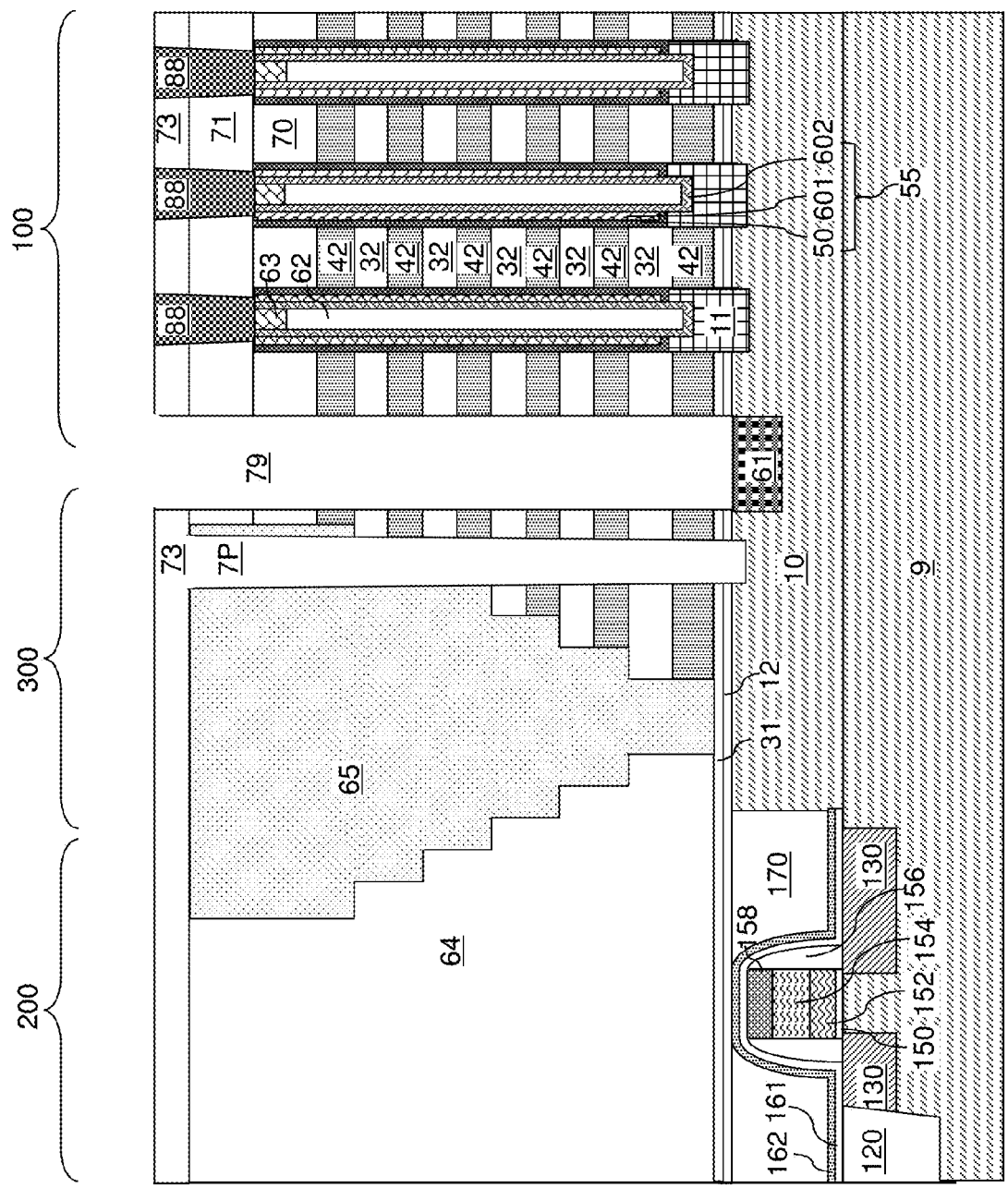
FIG. 5A is a vertical cross-sectional view of the first exemplary structure after formation of a backside contact trench according to the first embodiment of the present disclosure.
Figure 5B:
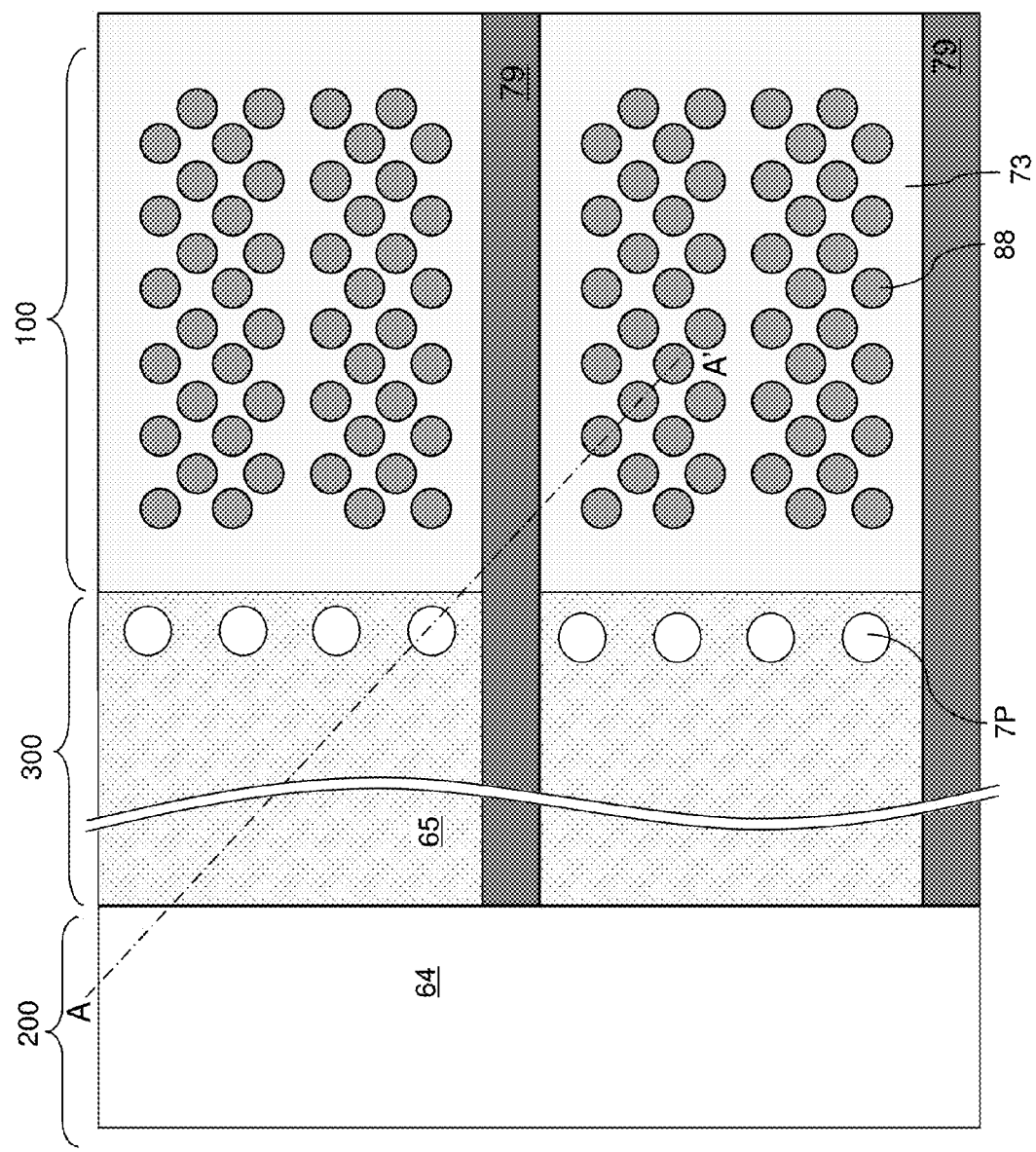
FIG. 5B is a partial see-through top-down view of the first exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the first array contact level dielectric layer 71 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar 7P can include silicon oxide and/or a dielectric metal oxide such as aluminum oxide. In one embodiment, the portion of the dielectric material that is deposited over the first array contact level dielectric layer 71 concurrently with deposition of the at least one dielectric support pillar 7P can be present over the first array contact level dielectric layer 71 as a second array contact level dielectric layer 73. Each of the at least one dielectric support pillar 7P and the second array contact level dielectric layer 73 is an optional structure. As such, the second array contact level dielectric layer 73 may, or may not, be present over the insulating cap layer 70 and the retro-stepped dielectric material portion 65. The first array contact level dielectric layer 71 and the second array contact level dielectric layer 73 are herein collectively referred to as at least one array contact level dielectric layer (71, 73). In one embodiment, the at least one array contact level dielectric layer (71, 73) can include both the first and second array contact level dielectric layers (71, 73), and optionally include any additional via level dielectric layer that can be subsequently formed. In another embodiment, the at least one array contact level dielectric layer (71, 73) can include only the first array contact level dielectric layer 71 or the second array contact level dielectric layer 73, and optionally include any additional via level dielectric layer that can be subsequently formed. Alternatively, formation of the first and second array contact level dielectric layers (71, 73) may be omitted, and at least one via level dielectric layer may be subsequently formed, i.e., after formation of a backside contact via structure.

The second array contact level dielectric layer 73 and the at least one dielectric support pillar 7P can be formed as a single contiguous structure of integral construction, i.e., without any material interface therebetween. In another embodiment, the portion of the dielectric material that is deposited over the first array contact level dielectric layer 71 concurrently with deposition of the at least one dielectric support pillar 7P can be removed, for example, by chemical mechanical planarization or a recess etch. In this case, the second array contact level dielectric layer 73 is not present, and the top surface of the first array contact level dielectric layer 71 can be physically exposed.

Memory contact via structures 88 can be formed through the first and second array contact level dielectric layers (73, 71). Specifically, a photoresist layer can be applied over the second array contact level dielectric layer 73, and can be lithographically patterned to form openings overlying the drain structures 63. An anisotropic etch can be performed to transfer the pattern in the photoresist layer through the first and second array contact level dielectric layers (73, 71) to form memory contact via cavities that extend through the first and second array contact level dielectric layers (73, 71). The memory contact via cavities can be filled with at least one conductive material. Excess portions of the at least one conductive material can be removed from above a horizontal plane including a top surface of the second array contact level dielectric layer 73. Each remaining contiguous portion of the at least one conductive material constitutes a memory contact via structure 88, which contacts a top surface of an underlying drain region 63. The photoresist layer can be subsequently removed, for example, by ashing. Alternatively, structures 88 may be formed at a later step shown in FIG. 11.

Another photoresist layer (not shown) can be applied over the alternating stack (32, 42) and/or the retro-stepped dielectric material portion 65, and lithographically patterned to form at least one backside contact trench 79 in an area in which formation of a backside contact via structure is desired. The trench 79 may extend through region 100 or through both regions 100 and 300. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. A source region 61 can be formed by implanting electrical dopants through each backside contact trench into a semiconductor portion located on, or within, the substrate (9, 10). For example, a source region 61 may be formed by implantation of dopant atoms into a portion of the semiconductor material layer 10 through each backside contact trench 79. Alternatively, a semiconductor portion can be formed on the substrate (9, 10) by deposition of a semiconductor material, for example, by selective epitaxy, and by implantation of electrical dopants into the deposited semiconductor portion.

Figure 6:
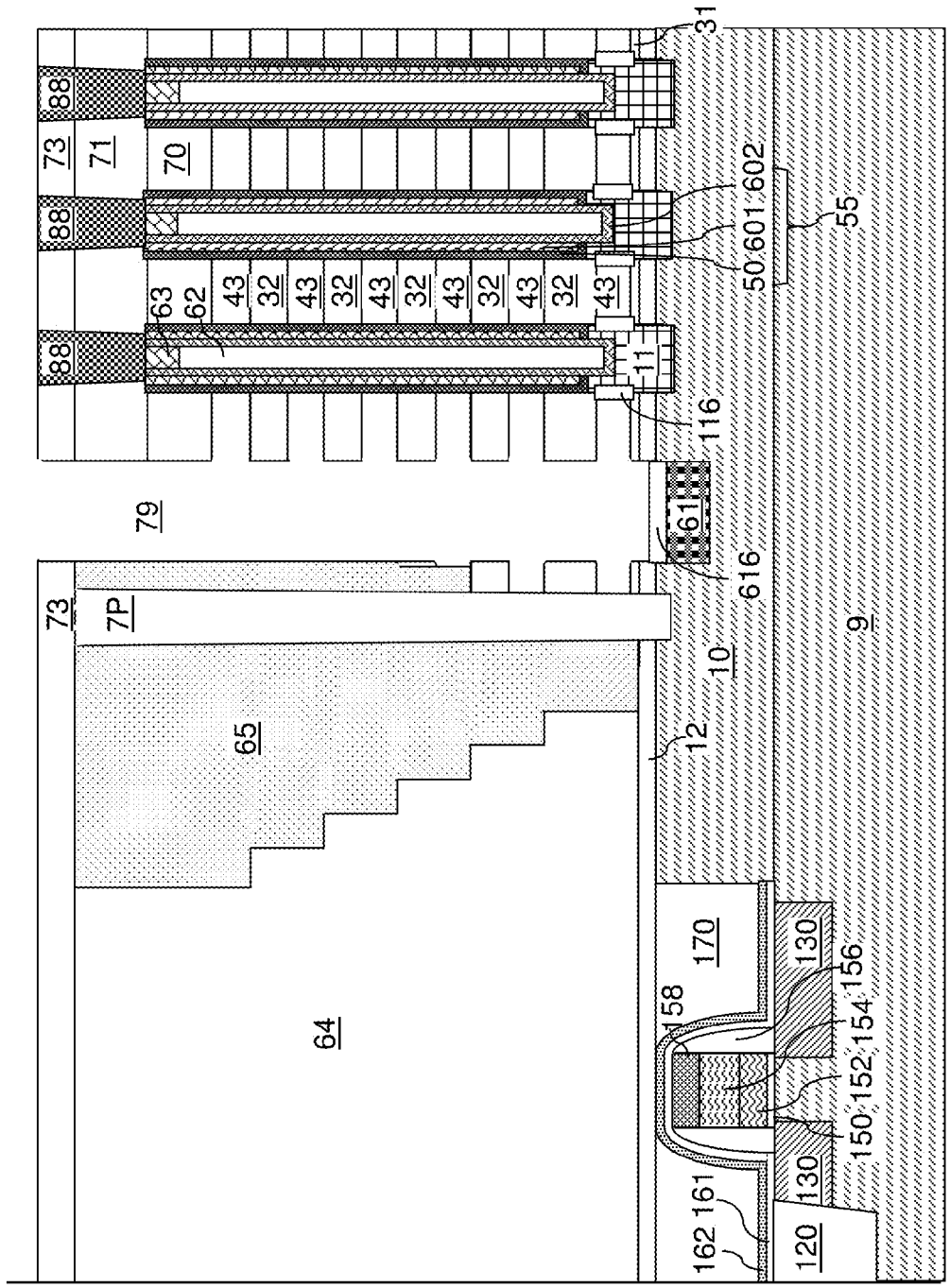
FIG. 6 is a vertical cross-sectional view of the first exemplary structure after formation of backside recesses according to the first embodiment of the present disclosure.

Referring to FIG. 6, an etchant that selectively etches the second material of the sacrificial material layers 42 with respect to the first material of the insulating layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

Figure 7A:
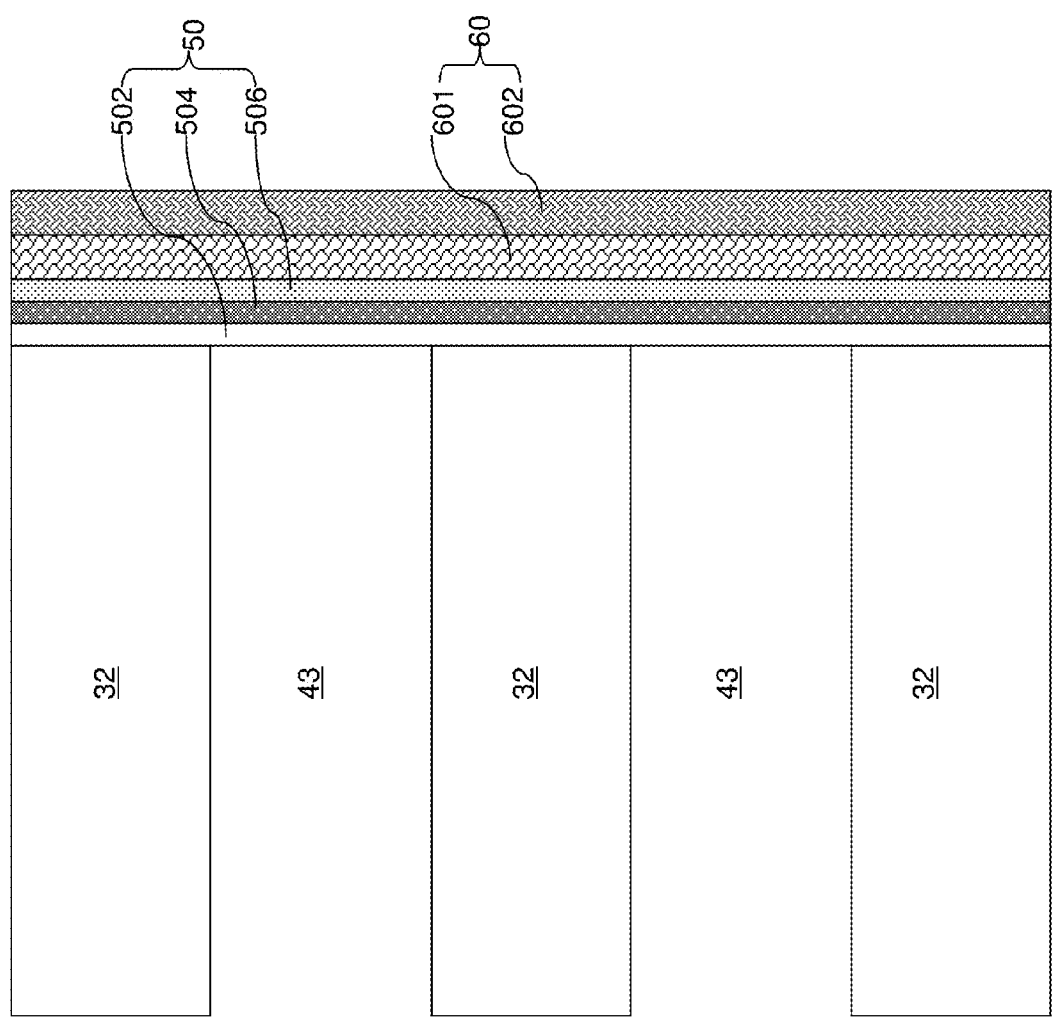

Referring to FIG. 7A, a magnified view of a region including backside recesses 43 is shown after the processing steps of FIG. 6. The illustrated region is representative of each backside recess 43 extending between a memory stack structure 55 and a backside contact trench 79.

Referring to FIG. 7B, compositional modulation is induced in the blocking dielectric layers 502 and the insulating layers 32 by densifying with an anneal process. The anneal process can employ an in-situ steam generation (ISSG) anneal process in which steam ($H_2O$ vapor) is generated in-situ during the anneal. If the insulating layers 32 include silicon oxide, physically exposed surfaces of the insulating layers 32 can be densified by removing volatile atoms such as hydrogen and carbon. The insulating layers 32 can become stoichiometric silicon oxide ($SiO_2$). Subsequently, physically exposed portions of the blocking dielectric layers 502 are doped with dopant atoms. The dopant atoms can comprise atoms that retard diffusion of fluorine atoms upon combination with the material of the blocking dielectric layers 502 and the insulation layers 32. For example, if the blocking dielectric layers 502 and the insulation layers 32 comprise a silicon oxide layer, the dopant atoms can be nitrogen atoms. The compositional modulation induced in the blocking dielectric layers 502 and the insulation layers 32 is herein referred to as a first compositional modulation.

In one embodiment, the dopant atoms can be introduced into the physically exposed portions of the blocking dielectric layers 502 by plasma or thermal doping. In one embodiment, a plasma doping process can employ a plasma of a nitrogen-containing gas (such as $NH_3$ and/or $N_2$), and cause nitrogen atoms to diffuse into the physically exposed surface portions of the blocking dielectric layers 502. In another embodiment, a thermal doping process can employ a nitrogen-containing gas (such as $NH_3$ and/or $N_2$) in a gas phase. In this case, an elevated temperature can be employed to induce diffusion of nitrogen atoms from the gas phase into the physically exposed surface portions of the blocking dielectric layers 502.

If each blocking dielectric layer 502 comprises a silicon oxide layer as the only layer or as the outermost layer, and if nitrogen atoms are employed as dopant atoms that induce the first compositional modulation, physically exposed portions of the blocking dielectric layers 502 can be converted into silicon oxynitride portions 502N, while portions of the silicon oxide layer that are adjacent to the insulating layers 32 can remain as silicon oxide portions. Alternatively, surface portions of the insulating layers 32 underlying the blocking dielectric layers 502 can be converted into silicon oxynitride layers. As used herein, "silicon oxynitride" refers to a silicon-based dielectric material in which atomic concentration of oxygen is greater than 1.0 percent and the atomic concentration of nitrogen is greater than 1.0 percent. As used herein, "silicon oxide" refers to a dielectric material composed primarily of silicon and oxygen optional dopant atoms such as boron, phosphor, and/or fluorine and containing, if any, nitrogen atoms at an atomic concentration that does not exceed 1.0 percent. In one embodiment, each of the blocking dielectric layers 502 can have a uniform thickness throughout the entirety thereof.

In one embodiment, the blocking dielectric layers 502 comprise silicon oxide having a homogeneous composition prior to the plasma or thermal doping, and each of the blocking dielectric layers 502 comprise an alternating stack of silicon oxide portions 502O and silicon oxynitride portions 502N after the plasma or thermal doping. The concentration of nitrogen atoms in the silicon oxynitride portions 502N can depend on the diffusion of nitrogen atoms through the material of the blocking dielectric layer 502 during the plasma or thermal doping process. Thus, the concentration of nitrogen atoms in the silicon oxynitride portions 502N can be dependent upon the proximity to the physically exposed surfaces of the blocking dielectric layer 502. In one embodiment, the atomic concentration of nitrogen atoms in the blocking dielectric layers 502 can decrease as a function of distance from the physically exposed surfaces of the silicon oxynitride portions 502N in portions of the blocking dielectric layers. The ratio of nitrogen to oxygen in the silicon oxynitride portions 502N may range from 5:95 to 95:5, for example, from 25:75 to 75:25.

In one embodiment, a second compositional variation can be collaterally induced within surface portions of the insulating layers 32. In this case, physically exposed portions of the insulating layers 32 can be doped with additional dopant atoms of the same species as the dopant atoms introduced into the physically exposed portions of the blocking dielectric layers 502 during the plasma doping.

In one embodiment, the insulating layers 32 prior to the plasma or thermal doping process can comprise silicon oxide, and the physically exposed portions of the insulating layers 32 can be converted to a silicon oxynitride layer 32N, while the inner portions of the insulating layers 32 that are spaced from the surfaces of the insulating layers 32 can remain as a silicon oxide layer 32O. Thus, each insulating layer 32 can include an inner silicon oxide layer 32O covered by, and encapsulated in, a respective outer silicon oxynitride layer 32N. The outer silicon oxynitride layer 32N and the silicon oxynitride portions 502N together form a continuous silicon oxynitride region in which the silicon oxynitride portions 502N form first vertical (i.e., perpendicular to the top substrate surface 7) portions, while each outer silicon oxynitride layer 32N forms second vertical portions and horizontal portions. Each horizontal portion connects a pair of adjacent, laterally offset first and second vertical portions.

Figure 7C:
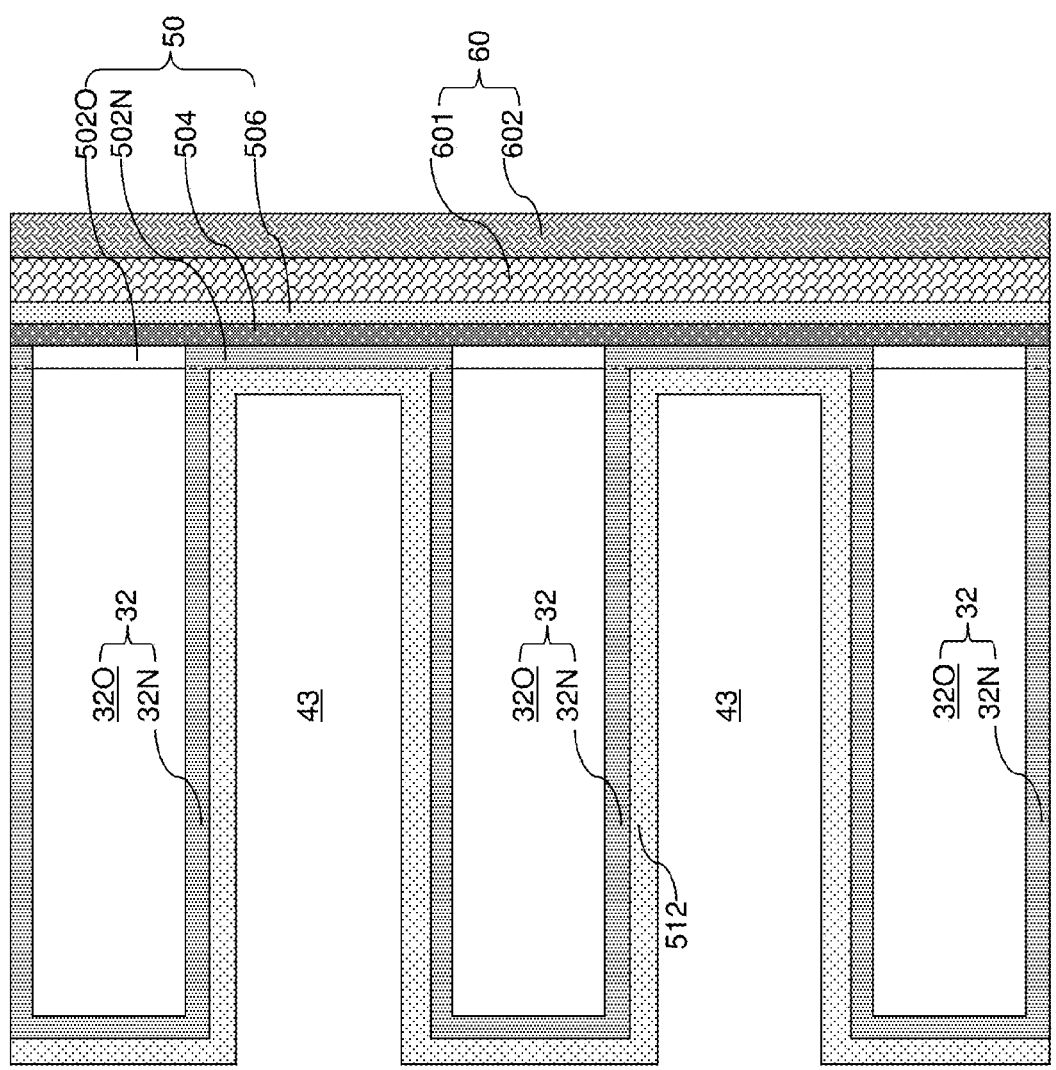

Referring to FIG. 7C, a backside blocking dielectric layer 512 can be optionally formed. The backside blocking dielectric layer 512, if present, comprises a dielectric material that functions as a portion of a control gate dielectric for the control gates to be subsequently formed in the backside recesses 43. In one embodiment, the backside blocking dielectric layer 512 comprises a dielectric metal oxide. As used herein, a "dielectric metal oxide" refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the backside blocking dielectric layer 512 can include a dielectric metal oxide having a dielectric constant greater than 7.9, i.e., having a dielectric constant greater than the dielectric constant of silicon nitride. In one embodiment, the backside blocking dielectric layer 512 can comprise aluminum oxide. The backside blocking dielectric layer 512 can be formed by a conformal deposition process such as chemical vapor deposition or atomic layer deposition. The thickness of the backside blocking dielectric layer 512 can be in a range from 1 nm to 10 nm, although lesser and greater thicknesses can also be employed.

Figure 7D:
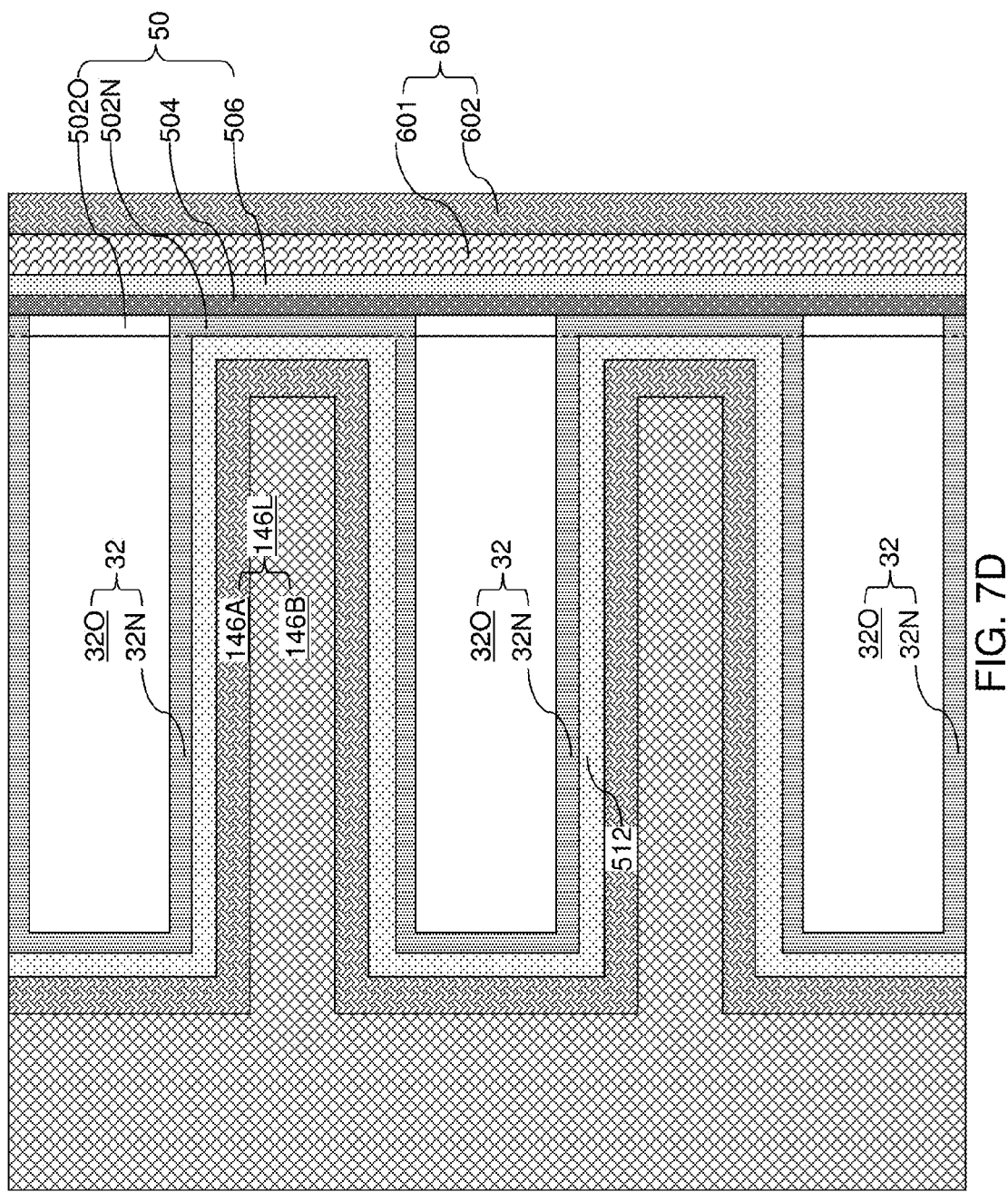

Referring to FIG. 7D, at least one metallic material can be deposited in the plurality of backside recesses 43, over the sidewalls of the at least one of the backside contact trench 79, and over the top surface of the second contact level dielectric layer 73. As used herein, a metallic material refers to an electrically conductive material that includes at least one metallic element.

Each of the at least one metallic material can be deposited by a conformal or superconformal deposition method, which can be, for example, chemical vapor deposition (CVD), atomic layer deposition (ALD), electroless plating, electroplating, or a combination thereof. The at least one metallic material can comprise one or more of an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the at least one metallic material can comprise a metal such as tungsten and/or metal nitride.

In one embodiment, the at least one metallic material can be deposited by first depositing a metallic liner layer 146A and subsequently depositing a metallic fill material layer 146B. The metallic liner layer 146A can comprise a metallic nitride material such as titanium nitride, tantalum nitride, and/or tungsten nitride and/or a metallic carbide material such as titanium carbide, tantalum carbide, and/or tungsten carbide. The metallic liner layer 146A can have a thickness in a range from 2 nm to 10 nm, although lesser and greater thicknesses can also be employed. The metallic fill material layer 146B fills remaining portions of the backside recesses 43. The metallic fill material layer 146B can comprise an elemental metal such as tungsten, ruthenium, cobalt, copper, aluminum, or an intermetallic alloy. In one embodiment, the at least one metallic material for filling the plurality of backside recesses 43 can be a combination of a titanium nitride layer employed as a metallic liner layer 146A and a tungsten fill material employed as the metallic fill material layer 146B.

In one embodiment, the at least one metallic material can be deposited employing at least one fluorine-containing precursor gas as a precursor gas during the deposition process. In one embodiment, the molecule of the at least one fluorine-containing precursor gas can comprise a compound of at least one tungsten atom and at least one fluorine atom. For example, if the metallic material (e.g., metallic fill material) includes tungsten, $WF_6$ and $H_2$ can be employed during the deposition process.

The combination of the metallic liner layer 146A and the metallic fill material layer 146B constitutes a contiguous conductive material layer 146L. In one embodiment, the atomic concentration of nitrogen atoms in the blocking dielectric layers 502 can decrease as a function of distance from the portions of the contiguous conductive material layer 146L that fills the backside recesses 43. Each portion of the contiguous conductive material layer 146L that fills a backside recess constitutes an electrically conductive layer.

Figure 8:
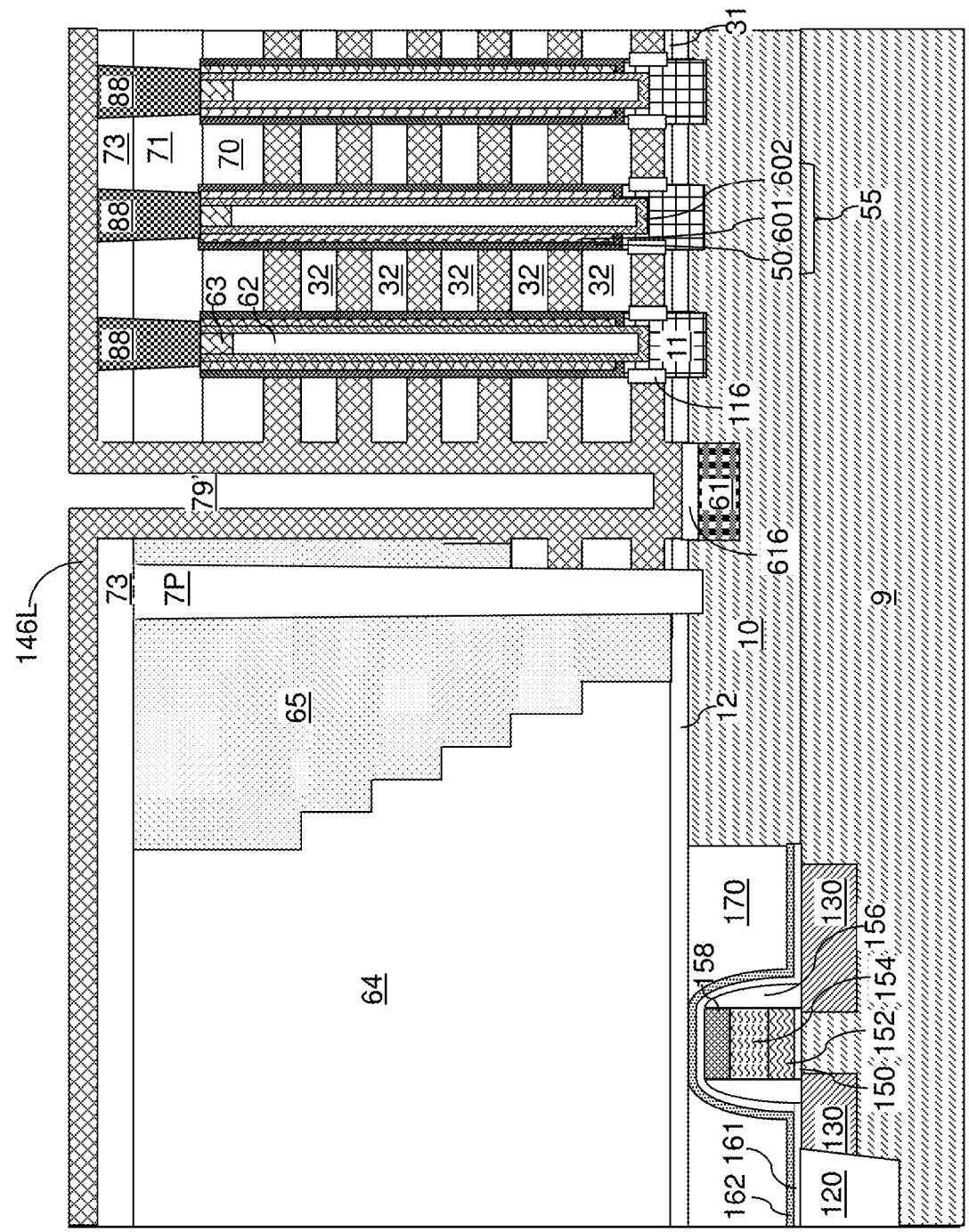
FIG. 8 is a vertical cross-sectional view of the first exemplary structure after formation of the electrically conductive layers according to the first embodiment of the present disclosure.

Referring to FIG. 8, the first exemplary structure is illustrated after the processing steps of FIG. 7D. The optional backside blocking dielectric layer 512 is not explicitly illustrated in FIG. 8 for clarity. A backside cavity 79' can be present in an unfilled volume of the backside contact trench 79. A plurality of electrically conductive layers is present in the plurality of backside recesses 43. The contiguous conductive material layer 146L is present over the sidewalls of each backside contact trench 79 and over the at least one contact level dielectric layer (71, 73). Thus, each sacrificial material layer 42 can be replaced with an electrically conductive layer.

Figure 9:
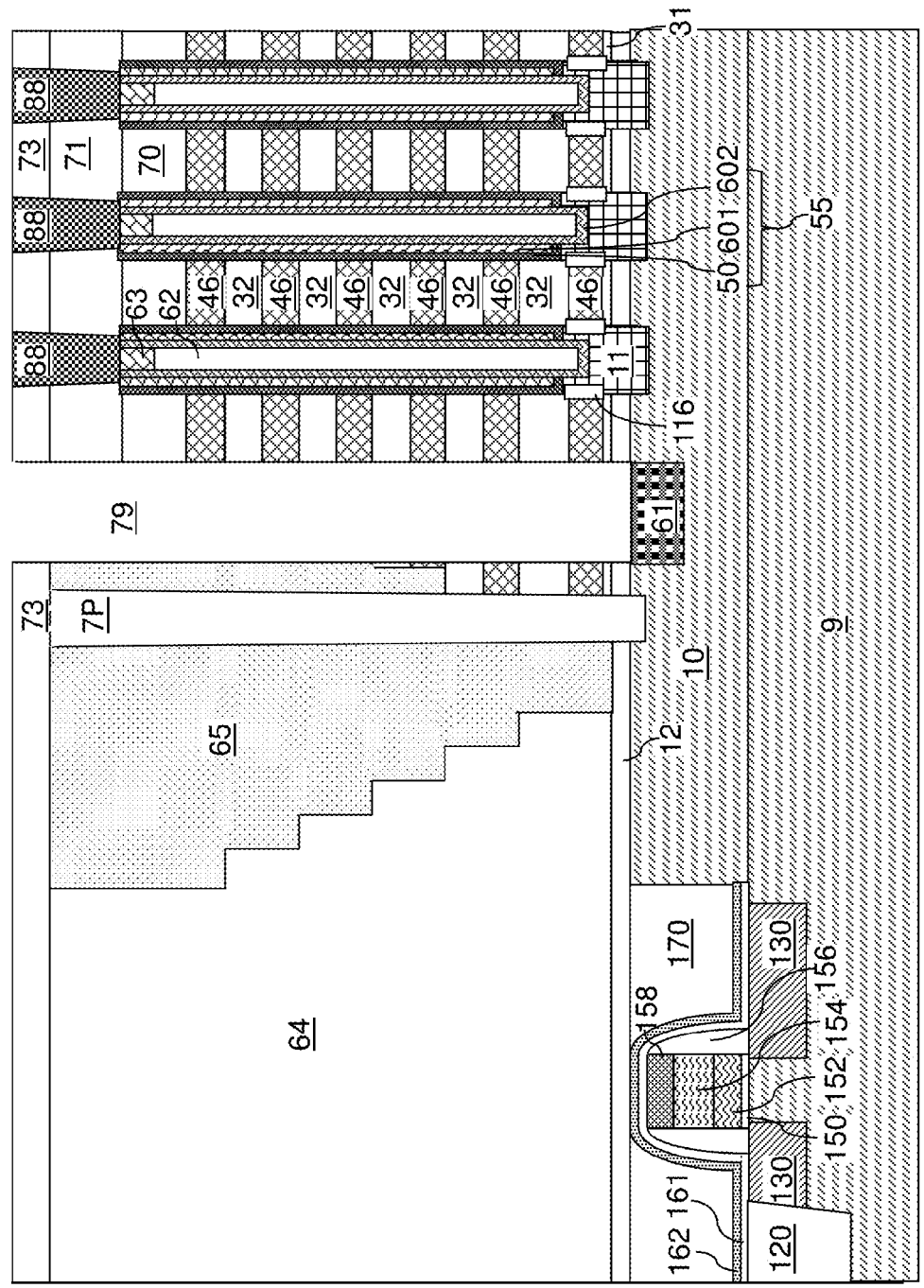
FIG. 9 is a vertical cross-sectional view of the first exemplary structure after removing conductive materials from inside a backside contact trench according to the first embodiment of the present disclosure.

Referring to FIG. 9, the deposited metallic material of the contiguous conductive material layer 146L is etched back from the sidewalls of each backside contact trench 79 and from above the second contact level dielectric layer 73, for example, by an isotropic wet etch or dry etch or the combination of isotropic wet etch and dry etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from above the source regions 61 during the last processing step of the anisotropic etch.

Figure 10:
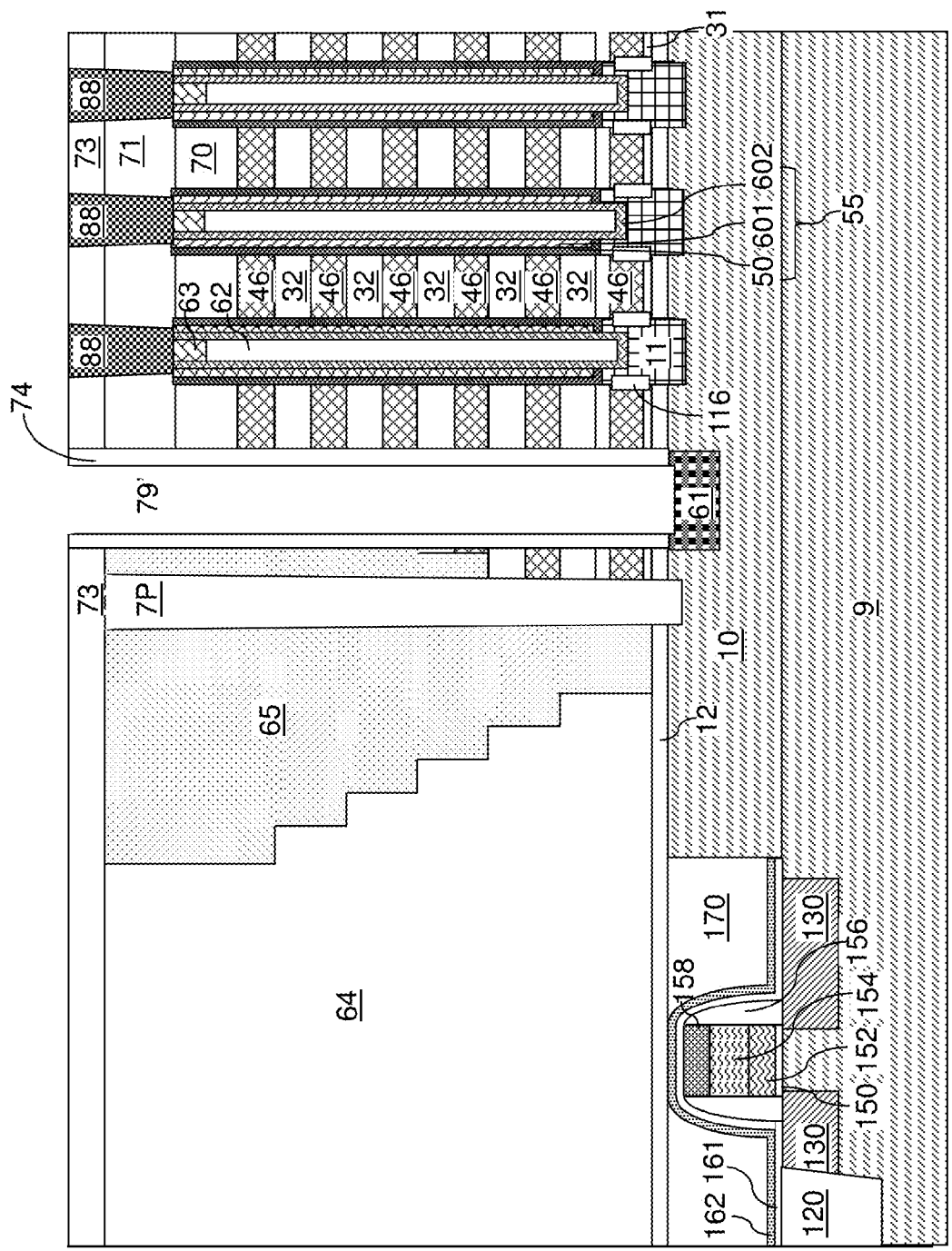
FIG. 10 is a vertical cross-sectional view of the first exemplary structure after formation of an insulating spacer according to the first embodiment of the present disclosure.

Referring to FIG. 10, an insulating material layer can be formed in the at least one backside contact trench 79 and over the second contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

An anisotropic etch is performed to remove horizontal portions of the insulating material layer and to optionally remove the horizontal portion of the backside blocking dielectric layer 512 from above the second contact level dielectric layer 73. Each remaining portion of the insulating material layer inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and can be formed directly on substantially vertical sidewalls of the backside blocking dielectric layer 512 and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm.

Figure 11:
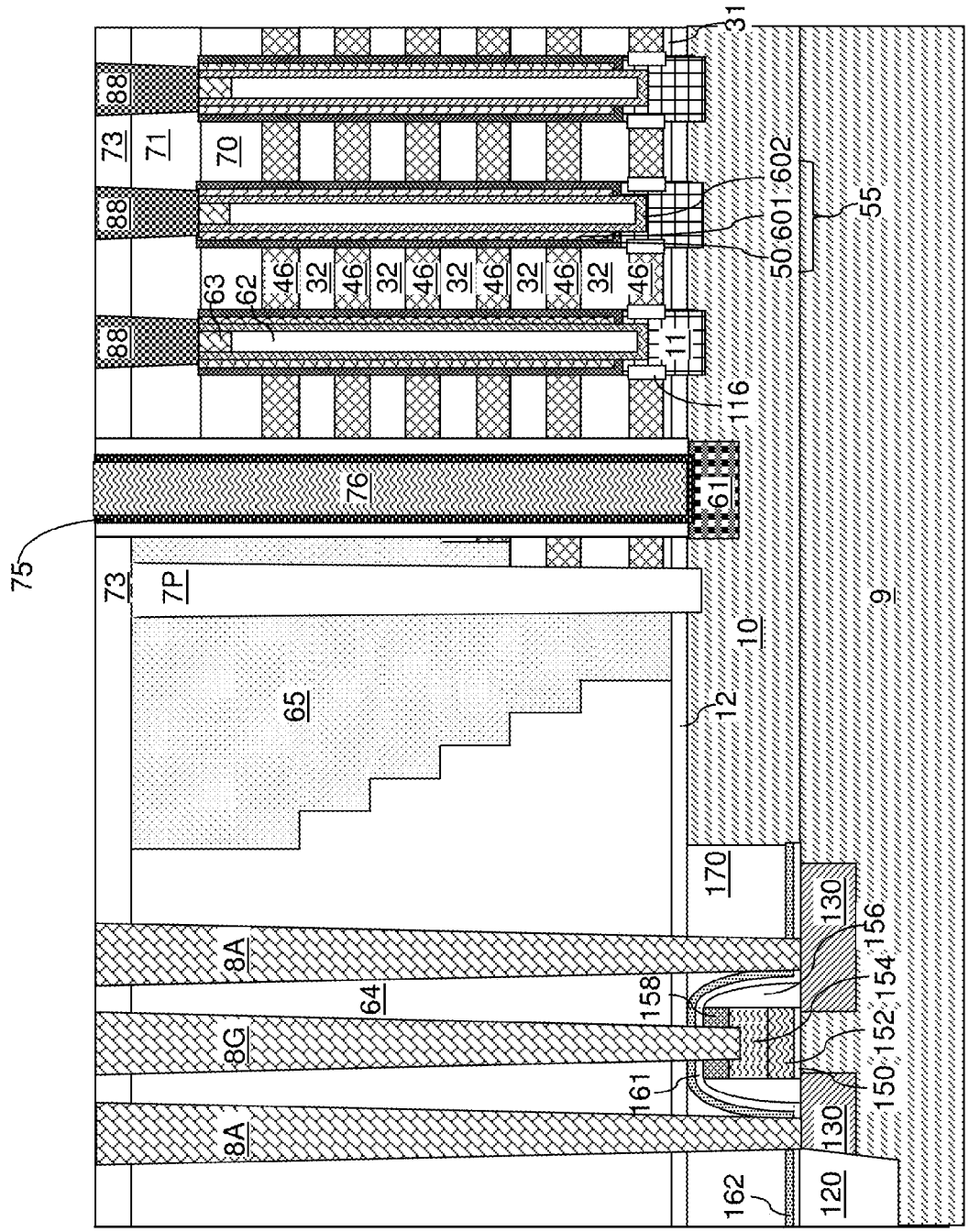
FIG. 11 is a vertical cross-sectional view of the first exemplary structure after formation of a backside contact via structure according to the first embodiment of the present disclosure.
Figure 12:
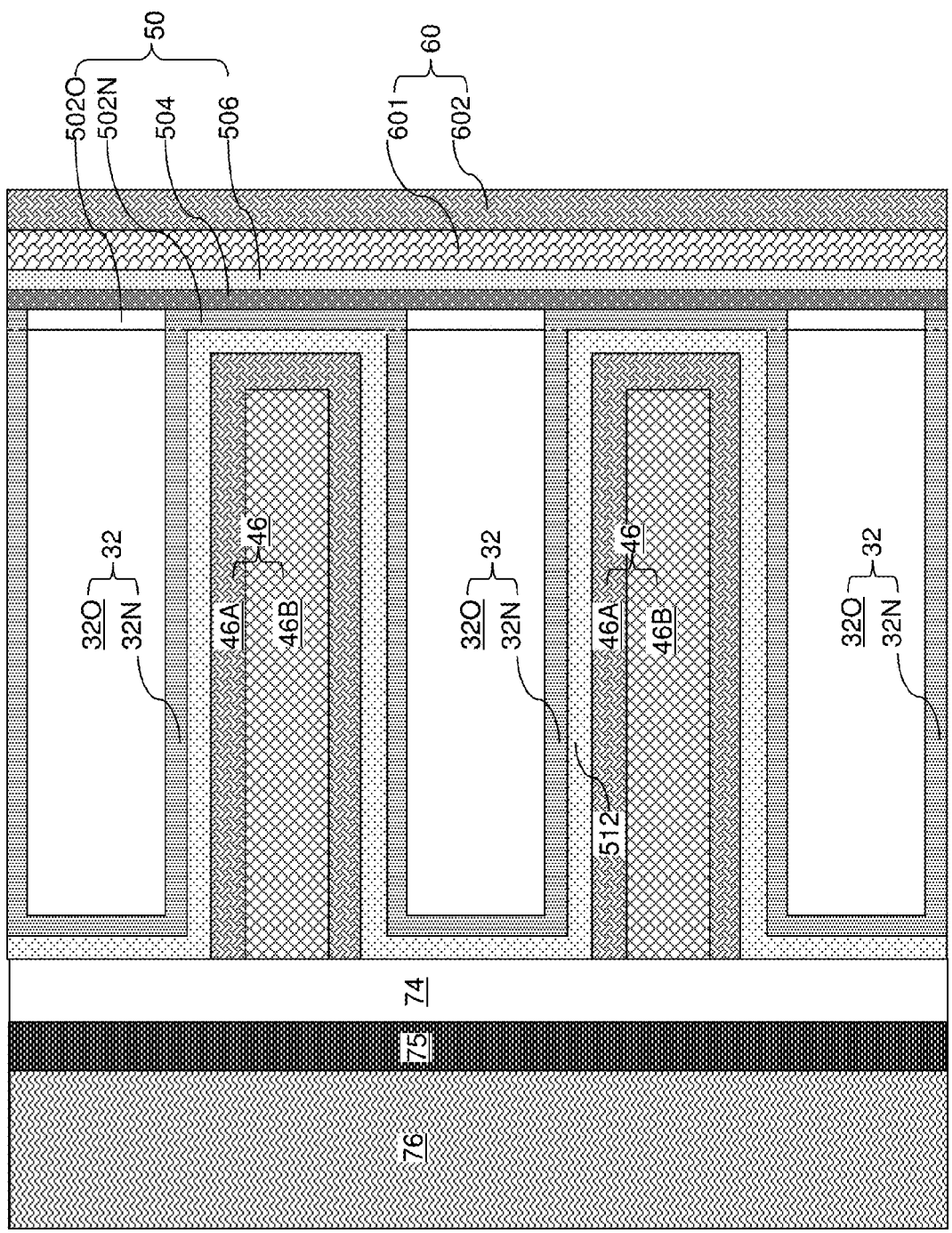
FIG. 12 is a magnified view of a region of the first exemplary structure of FIG. 11.

Referring to FIGS. 11 and 12, various contact via structures (8A, 8G) can be formed through dielectric material layers/portions of the exemplary structure. For example, peripheral device contact via structures (8G, 8A) can be formed in the peripheral device region to provide electrical contact to various nodes of the peripheral devices. The peripheral device contact via structures (8G, 8A) can include, for example, at least one gate contact via structure 8G and at least one active region contact via structure 8A.

A stepped surface region (not shown) in which the electrically conductive layers 46 are patterned to form stepped surfaces can be provided in the first exemplary structure. Control gate contact via structures (not shown) can be formed on the portions of the electrically conductive layers 46 that are present in the stepped surface region to provide electrical contact to the electrically conductive layers 46, which function as control gate electrodes of a three-dimensional memory device. If desired, the memory contact via structures 88 and/or the control gate contact via structures may be formed during the same step as structures 8G, 8A and/or during different steps.

The first exemplary structure can comprise a monolithic three-dimensional memory device. The monolithic three-dimensional memory device can comprise a stack of alternating layers comprising insulating layers 32 and electrically conductive layers 46 and located over a substrate (9, 10). A memory opening 49 extends vertically through the stack, and a memory film 50 and a semiconductor channel 60 are located within the memory opening. The memory film 50 comprises a blocking dielectric layer (502O, 502N) having a first compositional modulation along a vertical direction.

In one embodiment, the first compositional modulation comprises a modulation in atomic concentration of nitrogen atoms. The atomic concentration of nitrogen in the blocking dielectric layer (502O, 502N) decreases as a function of distance from the electrically conductive layers 46 in portions of the blocking dielectric layer (502O, 502N), i.e., in the silicon oxynitride portions 502N. In one embodiment, the first compositional modulation further comprises a modulation in atomic concentration of oxygen atoms. The atomic concentration of oxygen atoms in the blocking dielectric layer (502O, 502N) increases as a function of distance from the electrically conductive layers 46 in portions of the blocking dielectric layer (502O, 502N), i.e., in the silicon oxynitride portions 502N. In one embodiment, the blocking dielectric layer (502O, 502N) can have the same thickness throughout. In one embodiment, blocking dielectric layer (502O, 502N) comprises an alternating stack of silicon oxide portions 502O and silicon oxynitride portions 502N. A compositional gradient is present in regions of the silicon oxide portions that adjoin the insulating layers 32. Further, in case densification of silicon oxide in the insulating layers 32 is limited to surface regions of the insulating layers 32, the inner regions of the insulating layers 32 may have a lesser density than surface regions of the insulating layers 32.

In one embodiment, each insulating layer 32 can have a second compositional variation as a function of distance from an interface with an overlying or underlying electrically conductive layer 46 throughout the thickness of a respective outer silicon oxynitride layer 32N up to the silicon oxide inner layer 32O. Each electrically conductive layer 46 can include a metallic liner layer 46A and a metallic fill material layer 46B. The silicon oxynitride layers 32N and the silicon oxynitride portions 502N can retard, or prevent, diffusion of fluorine atoms that may be present in the electrically conductive layers 46 and/or that are present during deposition of the electrically conductive layers 46.

Figure 13A:
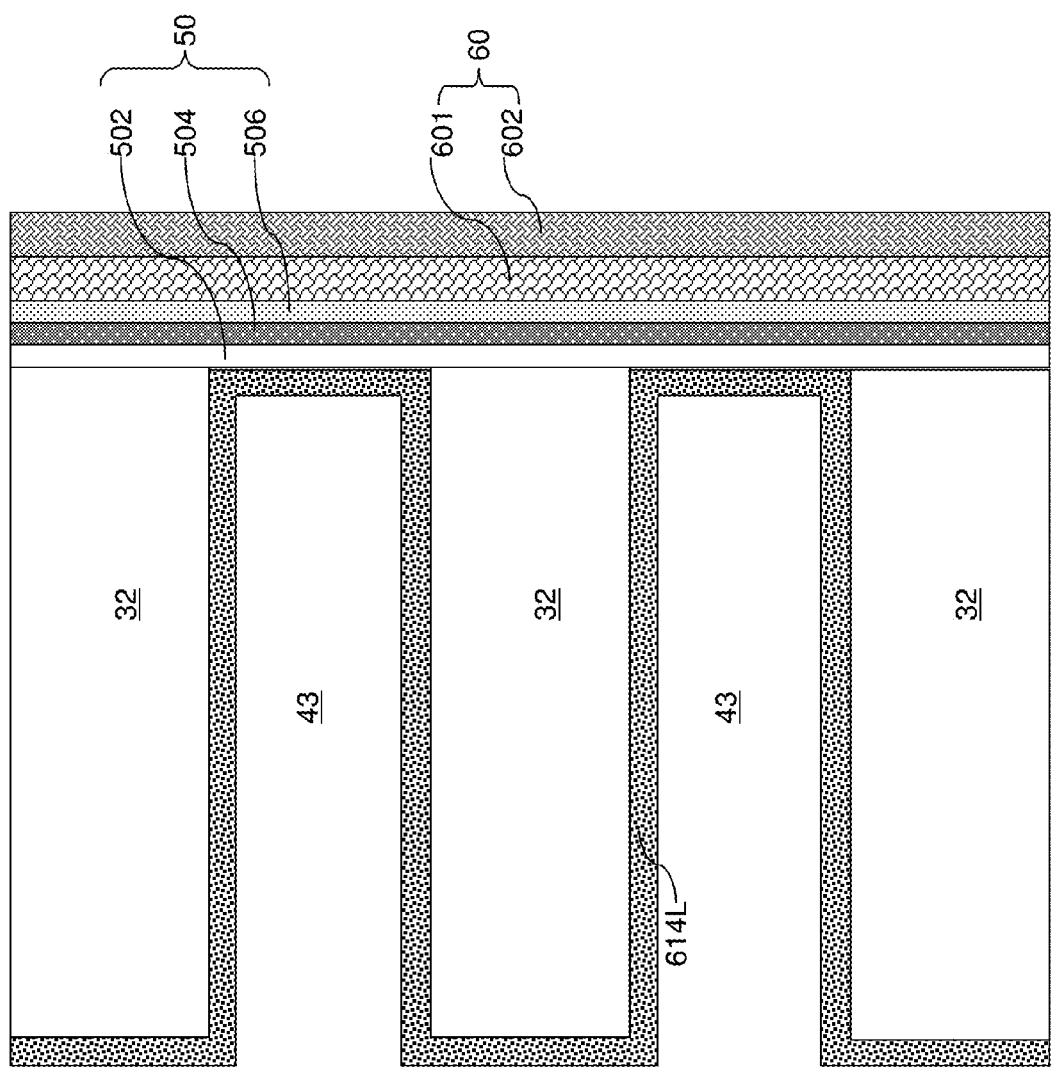
FIGS. 13A-13H are sequential vertical cross-sectional views of a region of a second exemplary structure around two backside recesses during formation of electrically conductive layers according a second embodiment of the present disclosure.

Referring to FIG. 13A, a magnified view of a second exemplary structure is shown for a region including backside recesses 43 extending between a backside cavity 79' within a backside contact trench 79 and a memory stack structure including a memory film 50 and a semiconductor channel 60. The second exemplary structure can be derived from the first exemplary structure of FIGS. 6 and 7A by depositing a backside blocking dielectric layer 614L in the backside recesses 43 and on the physically exposed sidewalls of the memory films 50 of the memory stack structures 55.

The backside blocking dielectric layer 614L can include a diffusion barrier dielectric material that blocks diffusion of fluorine atoms. In one embodiment, the backside blocking dielectric layer 614L can include a dielectric metal oxide such as aluminum oxide, lanthanum oxide, hafnium oxide, yttrium oxide, tantalum oxide, titanium oxide, or a combination thereof. In one embodiment, the backside blocking dielectric layer 614L can include aluminum oxide. The thickness of the backside blocking dielectric layer 614L can be in a range from 2 nm to 10 nm, although lesser and greater thicknesses can also be employed. The backside blocking dielectric layer 614L can be deposited by a conformal deposition process such as atomic layer deposition (ALD) or chemical vapor deposition (CVD). In one embodiment, the backside blocking dielectric layer 614L can be deposited as an amorphous dielectric metal oxide layer such as an amorphous aluminum oxide layer, which can be crystallized in a subsequent anneal process.

Figure 13B:
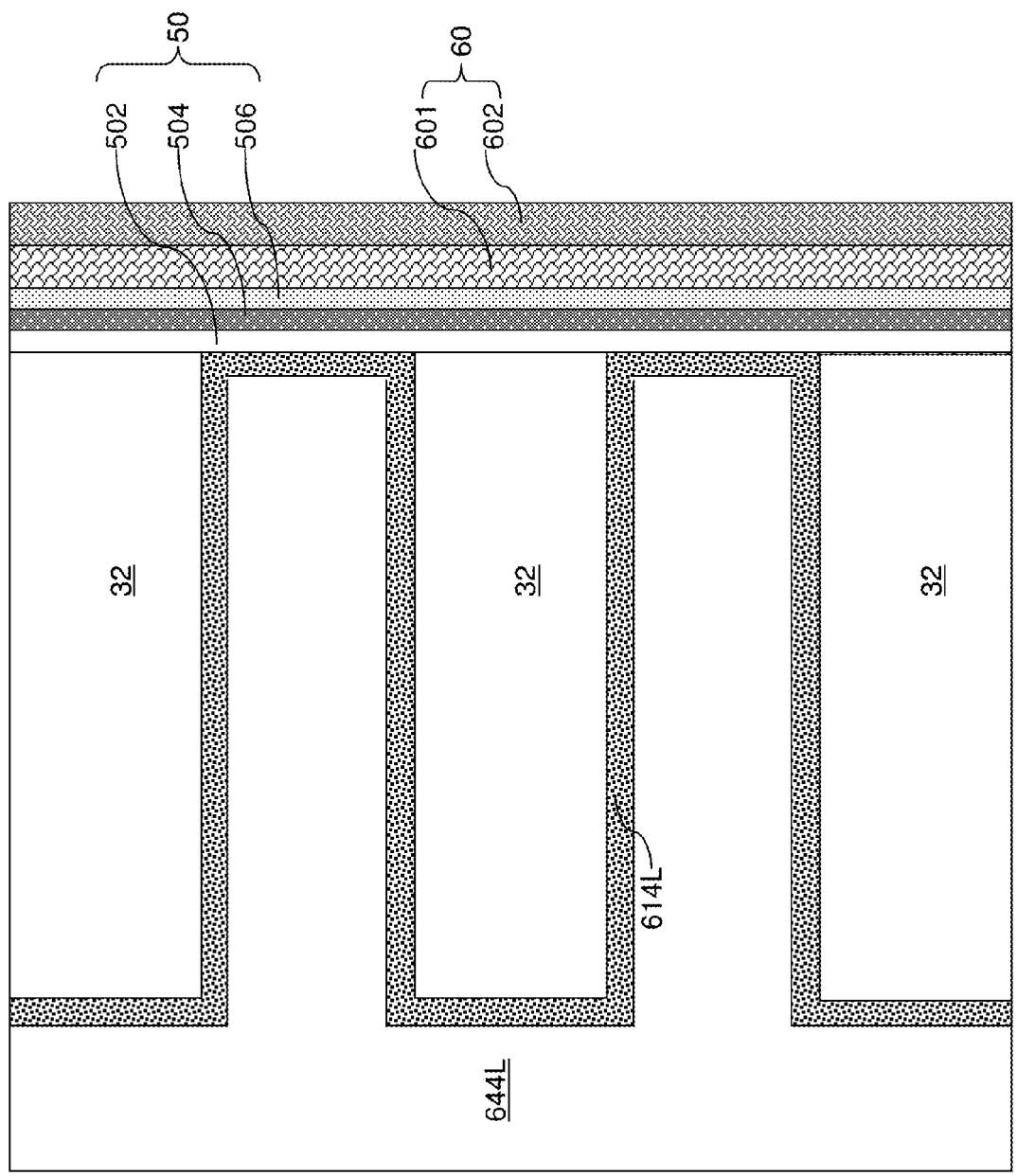

Referring to FIG. 13B, a sacrificial fill material layer 644L can be deposited to fill the backside recesses 43. The sacrificial fill material layer 644L comprises a material that can be removed by a subsequent etch process selective to the backside blocking dielectric layer 614L. In one embodiment, the sacrificial fill material layer 644L comprises a dielectric material such as undoped silicate glass, doped silicate glass, or organosilicate glass. In one embodiment, a backside cavity can be present within each backside contact trench 79 after deposition of the sacrificial fill material layer 644.

Figure 13C:
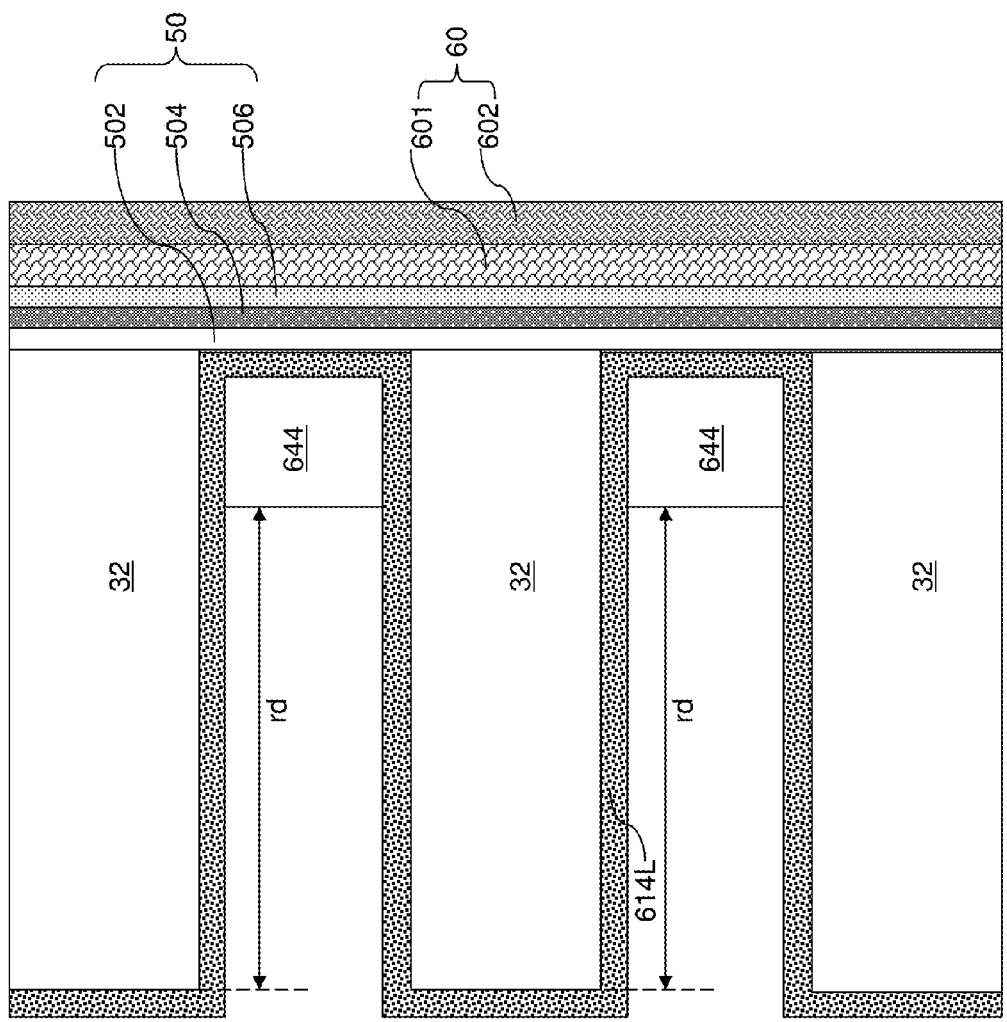

Referring to FIG. 13C, the sacrificial fill material layer 644L can be laterally recessed by an isotropic etch process. The isotropic etch can be a wet etch or an isotropic dry etch. For example, the isotropic etch can be a wet etch employing hydrofluoric acid for a silicon oxide layer 644L. The portions of the sacrificial fill material layer 644L in the at least one backside contact trench 79 can be removed, and the portions of the sacrificial fill material layer 644L proximal to the sidewalls of the at least one backside contact trench 79 can be removed as an etchant continues to etch the material of the sacrificial fill material layer 644L. The duration of the isotropic etch can be selected such that the etchant does not reach the vertical portions of the backside blocking dielectric layer 614L in contact with the sidewalls of the memory stack structures 55.

Each remaining portion of the sacrificial fill material layer 644L at each level from which portions of the sacrificial fill material layer 644L are etched constitutes a sacrificial fill material portion 644. Each sacrificial fill material portion 644 can protect the vertical portions of the backside blocking dielectric layer 614L in contact with the sidewalls of the memory stack structures 55. In one embodiment, each sacrificial fill material portion 644 can laterally surround a plurality of memory stack structures 55 located between a neighboring pair of backside contact trenches 79. In one embodiment, each inner sidewall surface of the sacrificial fill material portions 644 can contact a sidewall of the backside blocking dielectric layer 614L, and each outer sidewall surface of the sacrificial fill material portions 644 does not contact any sidewall of the backside blocking dielectric layer 614L. In one embodiment, the recess distance rd between each outer sidewall surface of the sacrificial fill material portions 644 and a vertical surface including a most proximal sidewall surface of the at least one backside contact trench 79 for the respective sacrificial fill material portion 644 can be the same irrespective of the levels and irrespective of selection of the sacrificial fill material portions 644.

Figure 13D:
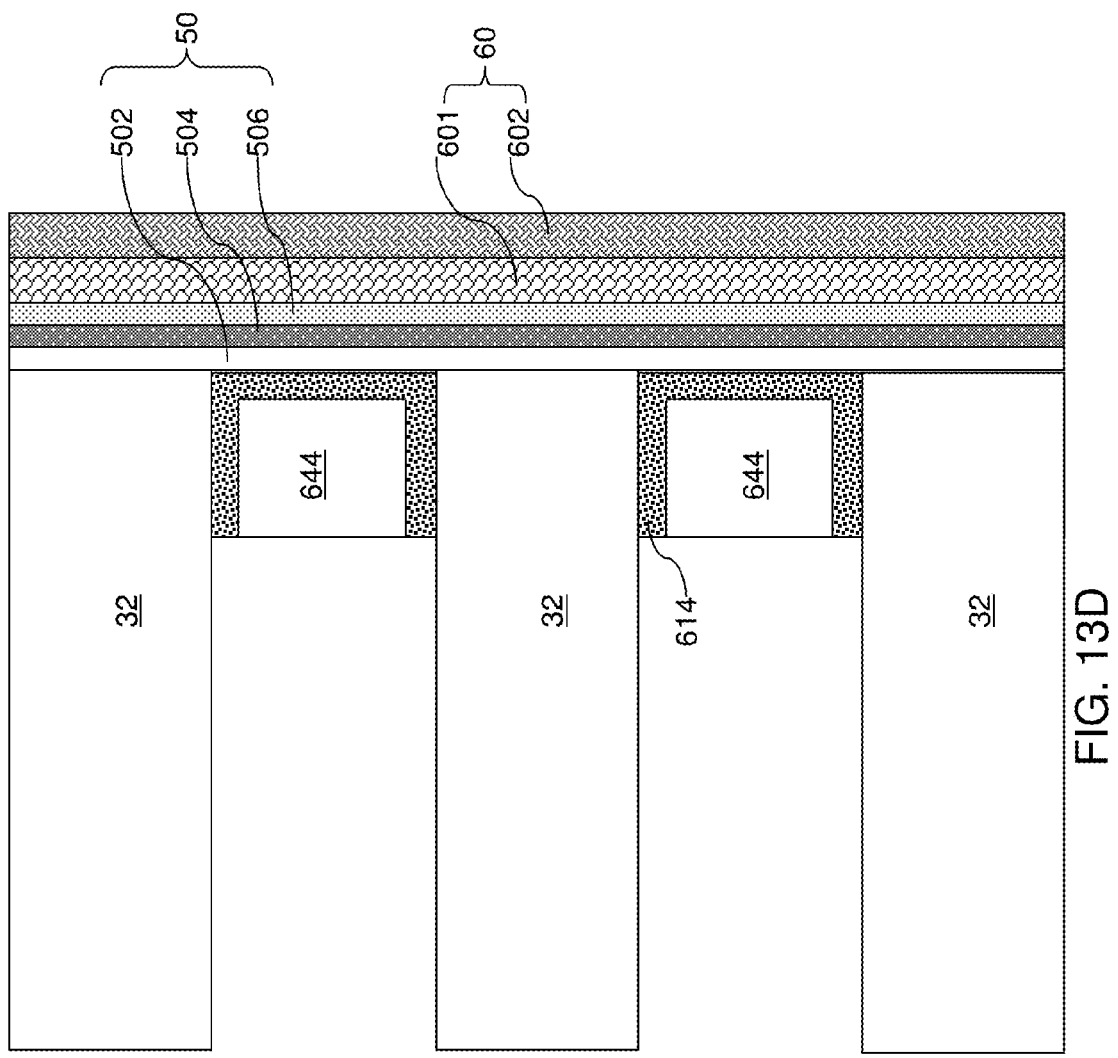

Referring to FIG. 13D, physically exposed portions of the backside blocking dielectric layer 614L can be removed by an isotropic etch that etches the dielectric material of the backside blocking dielectric layer 614L. The isotropic etch can be, for example, a wet etch, such as a hot phosphoric acid etch which etches amorphous aluminum oxide preferentially to silicon oxide portions 644. The chemistry of the wet etch can be selected to etch the dielectric material of the backside blocking dielectric 614L. The sacrificial fill material portions 644 may, or may not, be collaterally etched during etching of the physically exposed portions of the backside blocking dielectric layer 614L. In one embodiment, the etch process that etches the physically exposed portions of the backside blocking dielectric layer 614L may be selective to the dielectric material of the insulating layers 32. The remaining portions of the backside blocking dielectric layer 614L constitute blocking dielectric material portions 614. The blocking dielectric material portions 614 may be etched during the same or different etching step as layer 644L depending on the materials selected for layers 614L, 644L and on the etching medium.

Figure 13E:
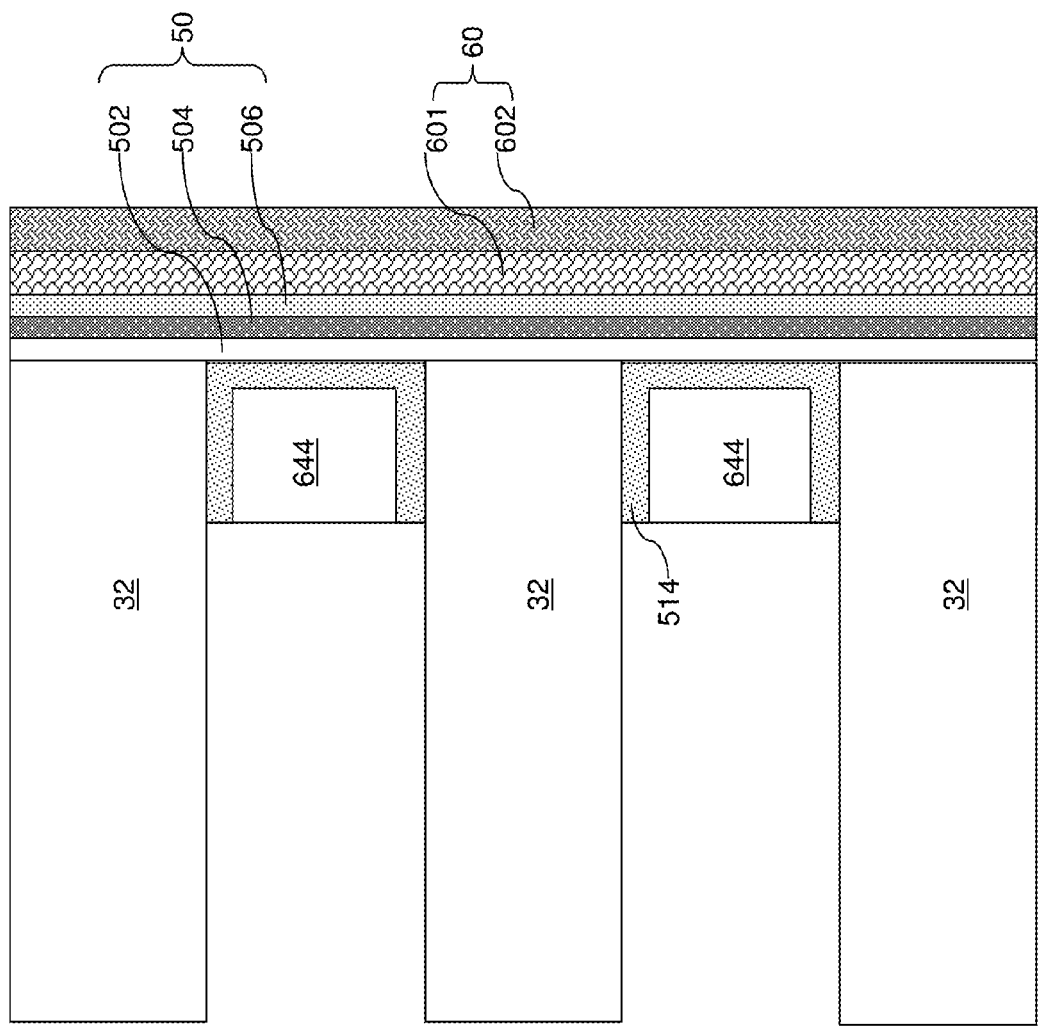

Referring to FIG. 13E, in case the backside blocking dielectric layer 614L is deposited as an amorphous material, the amorphous material can be converted into a polycrystalline material by an anneal process that is performed after laterally recessing the sacrificial fill material layer 644L and forming the sacrificial fill material portions 644. In one embodiment, the anneal process can be performed at an elevated temperature in a range from 400 degrees Celsius to 1,100 degrees Celsius. In this case, the blocking dielectric material portions 614 including an amorphous dielectric material can be converted into a set of blocking dielectric material portions 514 comprising a polycrystalline dielectric material, such as polycrystalline aluminum oxide. If the backside blocking dielectric layer 614L is formed as a polycrystalline material at the time of deposition, the anneal process can be omitted, and the blocking dielectric material portions 614 as formed at the processing steps of FIG. 13D can constitute the set of blocking dielectric material portions 514 comprising a polycrystalline dielectric material.

Figure 13F:
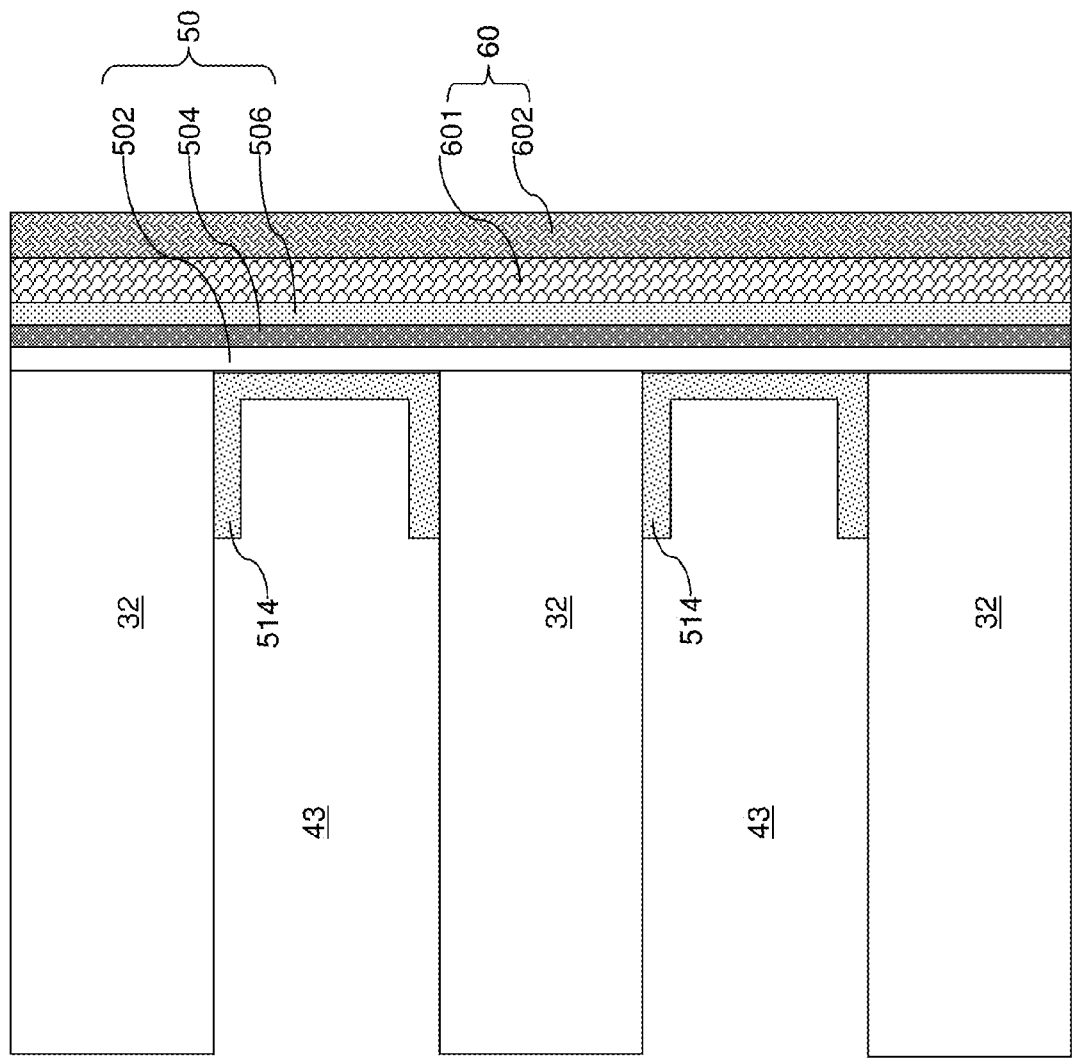

Referring to FIG. 13F, the sacrificial fill material portions 644 (i.e., the remaining portions of the sacrificial fill material layer 644L) can be removed by a selective isotropic etch. In one embodiment, the isotropic etch can employ an etch chemistry that removes the dielectric material of the sacrificial fill material portions 644 at a greater etch rate than the dielectric material of the insulating layers 32. In one embodiment, if the etching medium comprises hydrofluoric acid then the sacrificial fill material portions 644 can comprise borosilicate glass (BSG), borophosphosilicate glass (BPSG), or organosilicate glass (OSG), and the insulating layers 32 can comprise undoped silicate glass, which has a lower etch rate in hydrofluoric acid than the etch rates of borosilicate glass, borophosphosilicate glass, and organosilicate glass. The removal of the sacrificial fill material portions 644 can be selective to the set of blocking dielectric material portions 514.

Because the sacrificial fill material layer 644 is laterally recessed by the same recess distance rd from the sidewall of the backside contact trench 79 at each level of the backside recesses 43, each blocking dielectric material portion 514 within the set of blocking dielectric material portions 514 can be laterally spaced from the sidewalls of the backside contact trench 79 by a same distance, which can be substantially the same as the recess distance rd.

Figure 13G:
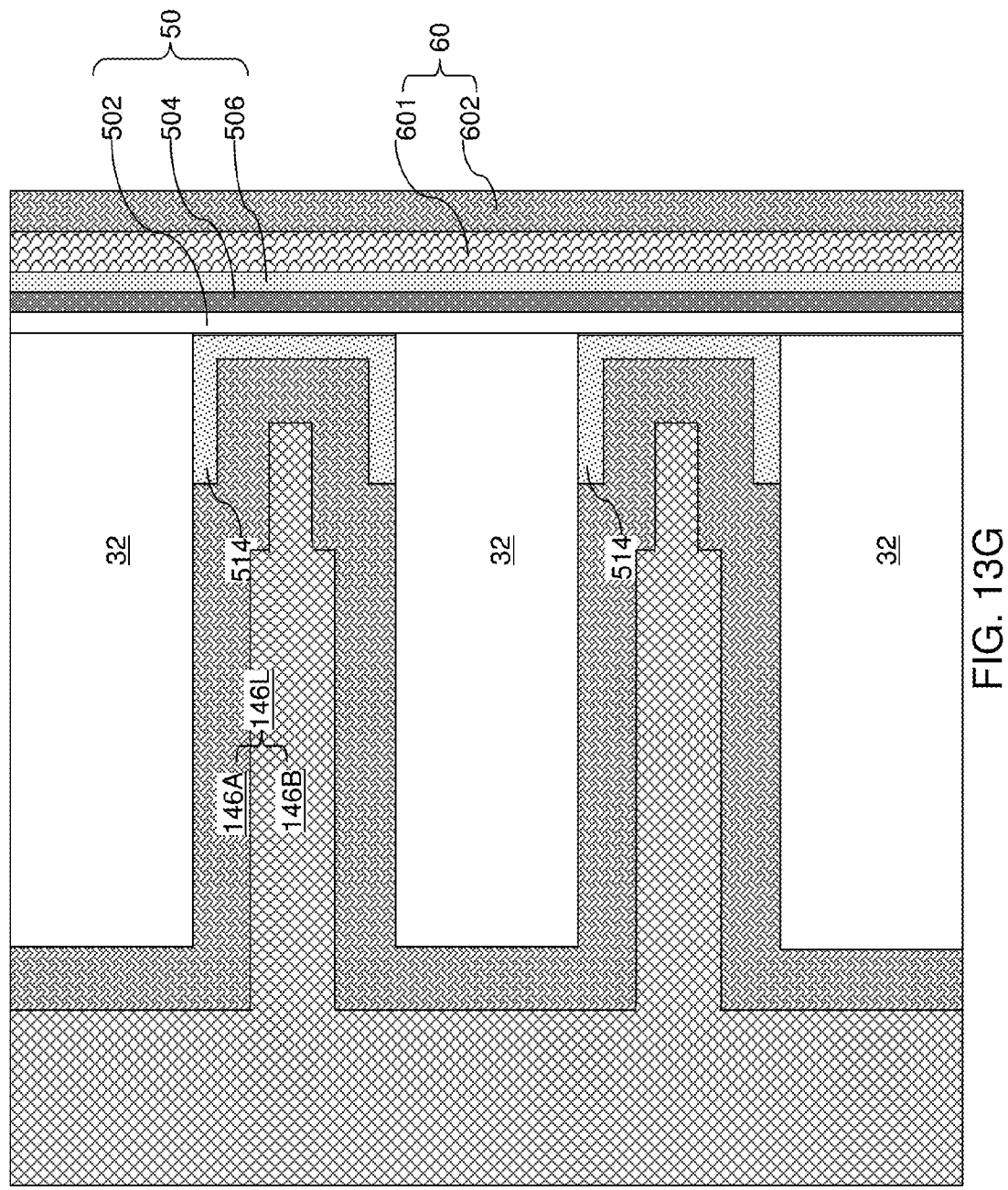

Referring to FIG. 13G, the processing steps of FIG. 7D can be performed to deposit at least one metallic material in the plurality of backside recesses 43, and to form a contiguous conductive material layer 146L. The contiguous conductive material layer 146L can comprise a layer stack of a metallic liner layer 146A and a metallic fill material layer 146B as in the first embodiment. In one embodiment, the at least one metallic material can be deposited employing at least one fluorine-containing precursor gas as a precursor gas during the deposition process.

Figure 13H:
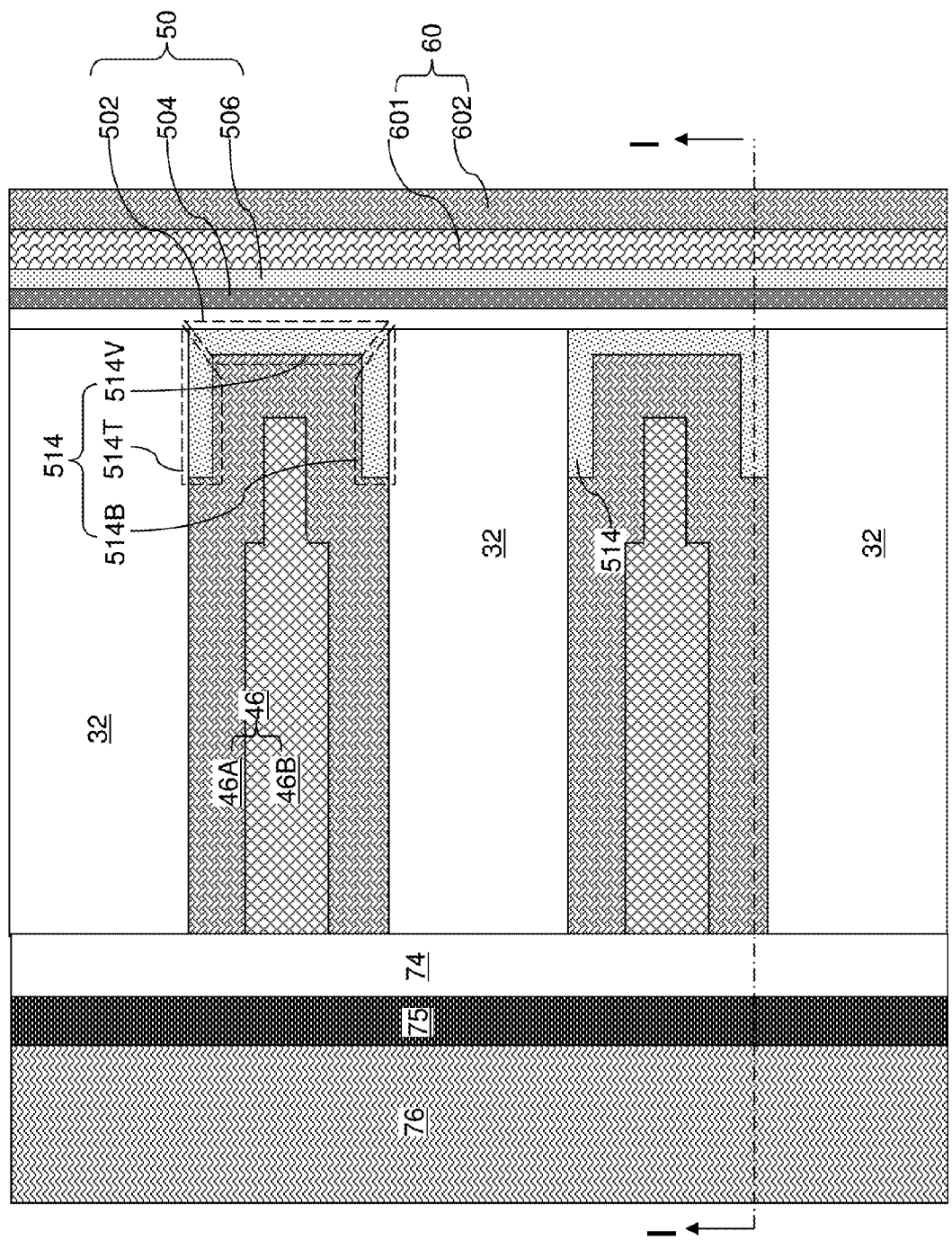
Figure 13I:
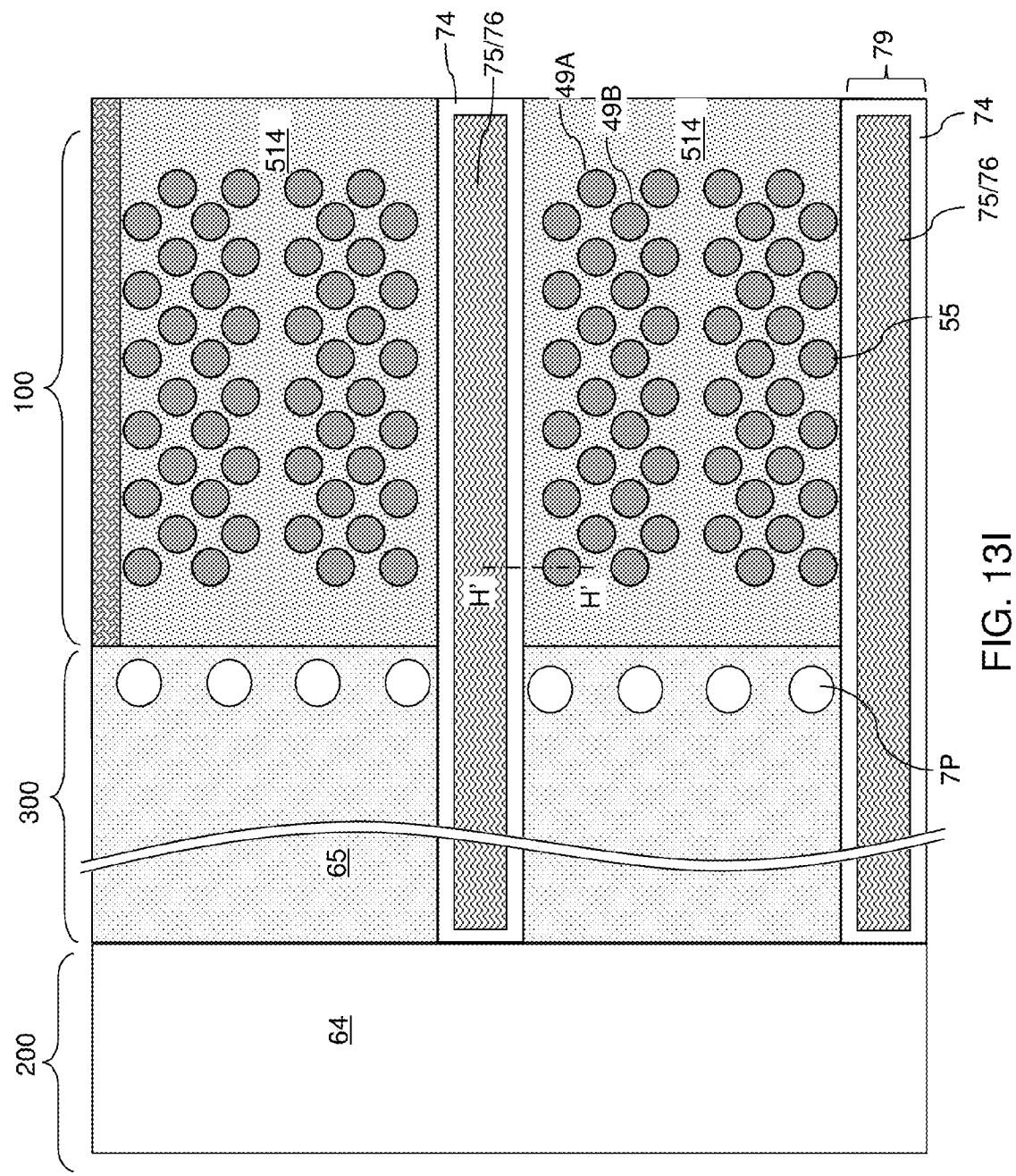
FIG. 13I is a horizontal cross-sectional view of the second exemplary structure along the horizontal plane I-I' of FIG. 13H. The vertical plane H-H' is the plane of the vertical cross-sectional view of FIG. 13H.

Referring to FIGS. 13H and 13I, the processing steps of FIGS. 9, 10, and 11 are sequentially performed to form electrically conductive layers 46 that fill each remaining volume of backside cavities 43. Each backside cavity is filled with a combination of a blocking dielectric material portion 514 and an electrically conductive layer 46. Each electrically conductive layer 46 can include a metallic liner layer 46A and a metallic fill material layer 46B. The set of blocking dielectric material portion 514 can retard, or prevent, diffusion of fluorine atoms that may be present in the electrically conductive layers 46.

The set of blocking dielectric material portions 514 can comprises a dielectric metal oxide material, such as polycrystalline alumina. Each of the blocking dielectric material portions 514 can comprise a vertical portion 514V contacting a sidewall of a respective electrically conductive layer 46, a top horizontal portion 514T extending outward from the memory opening and contacting a top surface of the respective electrically conductive layer 46, and a bottom horizontal portion 514B extending outward from the memory opening and contacting a bottom surface of the respective electrically conductive layer 46. A top surface of the top horizontal portion of each blocking dielectric material portion 514 can be coplanar with a topmost surface of the respective electrically conductive layer 46 located at the same level, and a bottom surface of the bottom horizontal portion of each blocking dielectric material portion is coplanar with a bottommost surface of the respective electrically conductive layer.

The second exemplary structure can comprise a monolithic three-dimensional memory device. The monolithic three-dimensional memory device can comprise a stack of alternating layers comprising insulating layers 32 and electrically conductive layers 46 and located over a substrate (9, 10), a first memory opening 49A extending vertically through the stack (32, 42), a first memory film 50 and a first semiconductor channel 60 located within the first memory opening 49A, and a set of blocking dielectric material portions 514 interposed between the first memory film 50 and each of the electrically conductive layers 46 (which can be embodied as multiple laterally separated portions). Each of the blocking dielectric material portions in the set can comprises a vertical portion 514V contacting a sidewall of a respective electrically conductive layer 46, a top horizontal portion 514T extending outward from the first memory opening 49A and contacting a top surface of the respective electrically conductive layer 46, and a bottom horizontal portion 514B extending outward from the first memory opening 49A and contacting a bottom surface of the respective electrically conductive layer 46. Each blocking dielectric material portion 514 within the set of blocking dielectric material portion 514 can be a metal oxide (e.g., polycrystalline aluminum oxide) which is laterally spaced from the backside contact trench 79 by a same lateral distance.

In one embodiment, the monolithic three-dimensional memory device can further comprise a second memory opening 49B extending vertically through the stack (32, 42) and laterally spaced from the backside contact trench 79 by a different distance than the first memory opening is from the backside contact trench 79, and a second memory film 50 and a second semiconductor channel 60 located within the second memory opening 49B. In one embodiment, an insulating spacer 74 can be located at a periphery of the backside contact trench 79. A contact via structure, i.e., a backside contact via structure 76, contacts a portion of the substrate (9, 10) (e.g., a source region 61) and located within the insulating spacer 74.

Figure 14A:
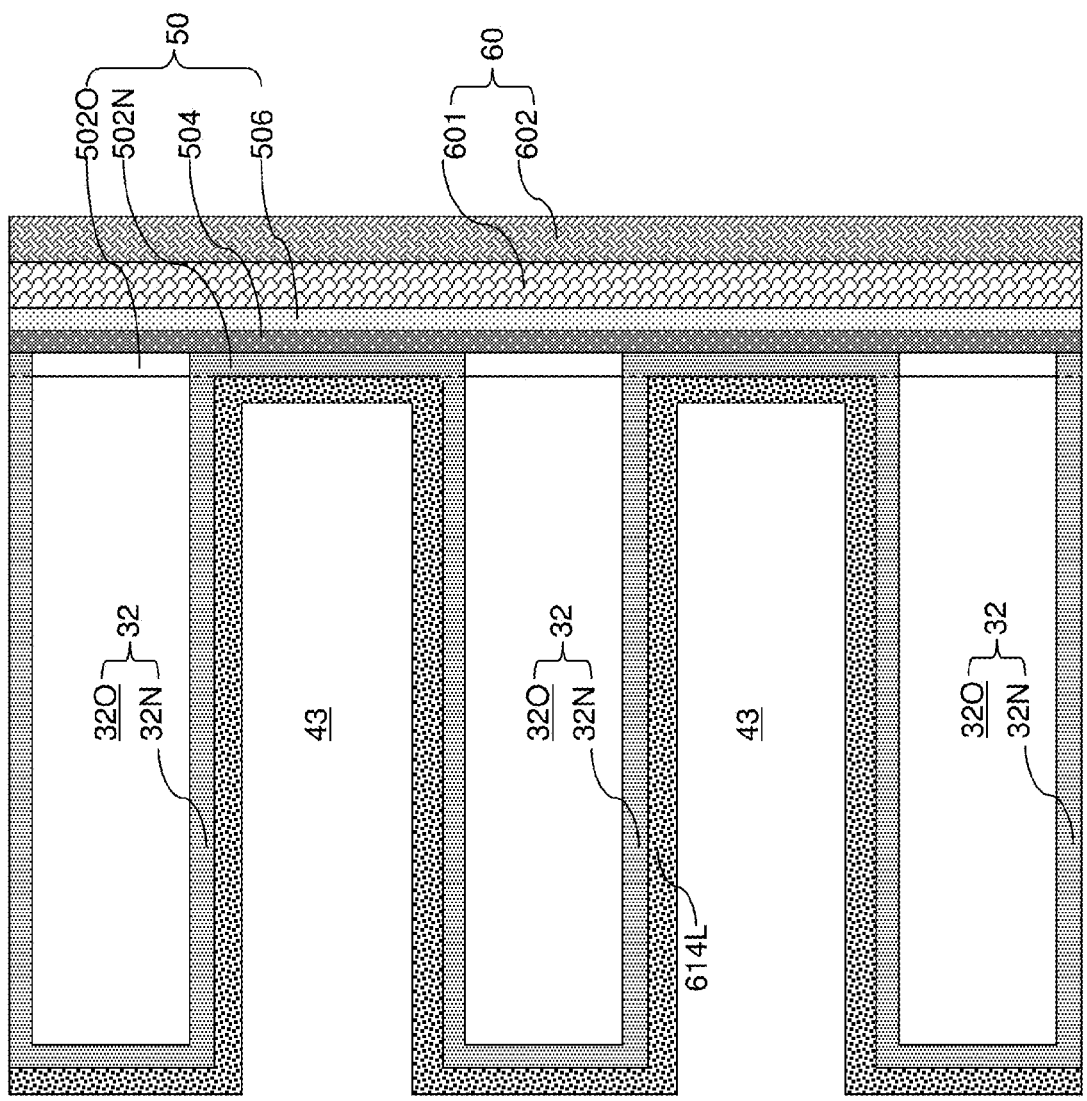

Referring to FIG. 14A, a third exemplary structure according to a third embodiment of the present disclosure can be derived from the first exemplary structure of FIG. 7B by forming the backside blocking dielectric layer 614L employing the processing steps of FIG. 13A over silicon oxynitride layers 32N and the silicon oxynitride portions 502N. The third embodiment is a combination of the first two embodiments, and includes both the silicon oxynitride layers 32N and the silicon oxynitride portions 502N of the first embodiment and the metal oxide blocking dielectric material portions 514 of the second embodiment.

Figure 14B:
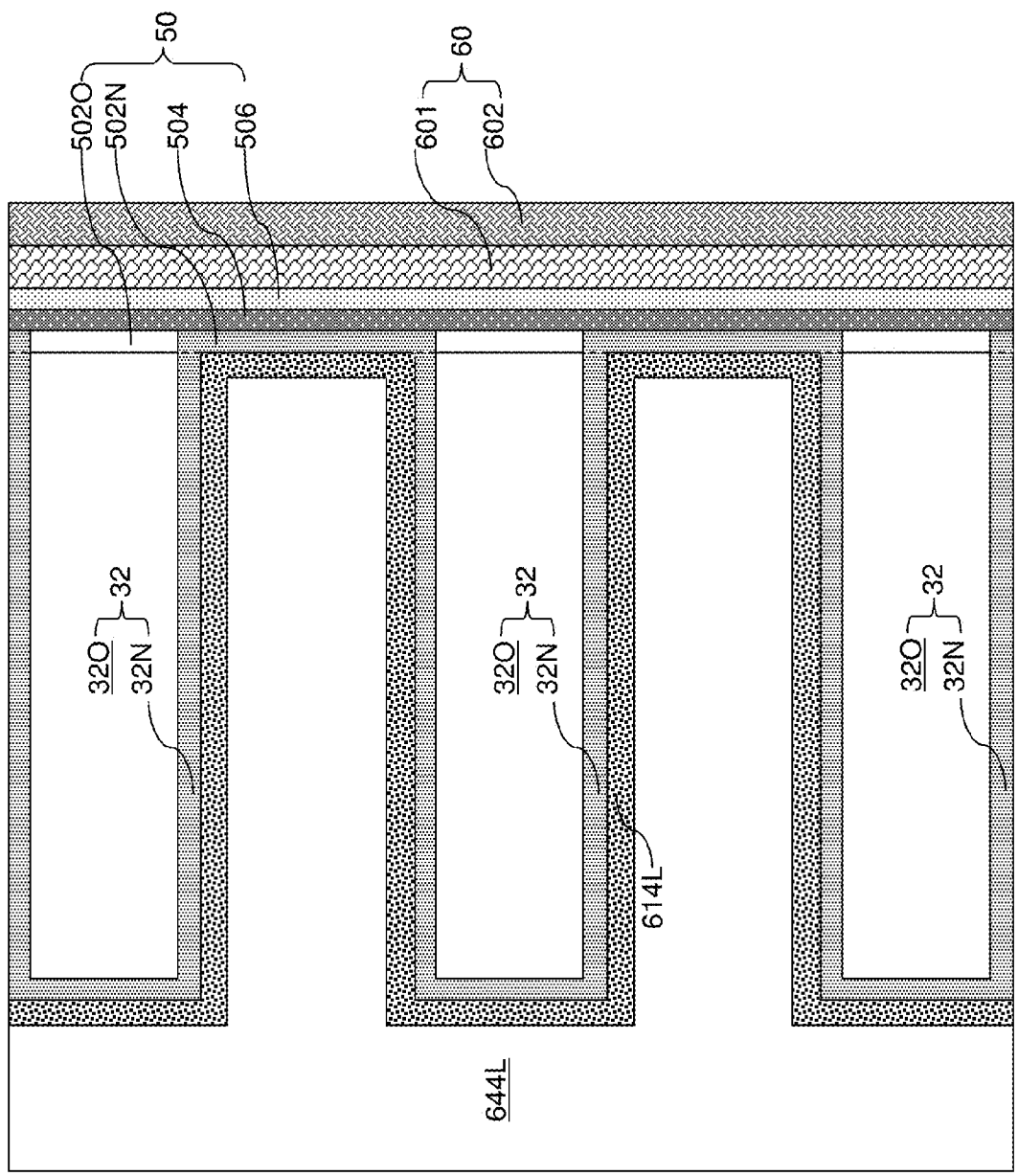

Referring to FIG. 14B, the processing steps of FIG. 13B are performed to deposit a sacrificial fill material layer 644L.

Referring to FIG. 14C, the processing steps of FIG. 13C are performed to laterally recess portions of the sacrificial fill material layer 644L. Remaining portions of the sacrificial fill material layer 644L constitute sacrificial fill material portions 644.

Figure 14D:
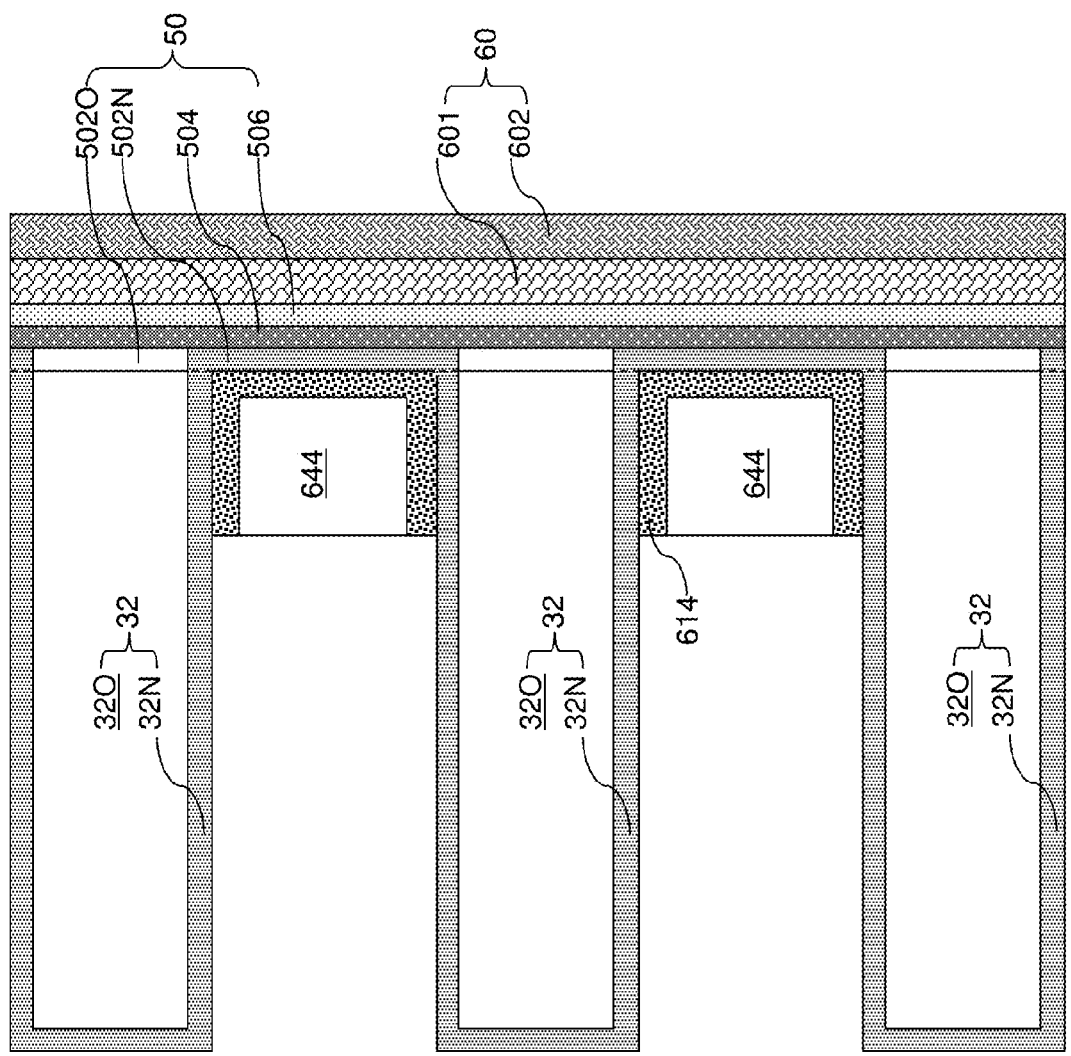

Referring to FIG. 14D, the processing steps of FIG. 13D are performed to etch physically exposed portions of the backside blocking dielectric layer 614L and to form backside blocking dielectric portions 614.

Figure 14E:
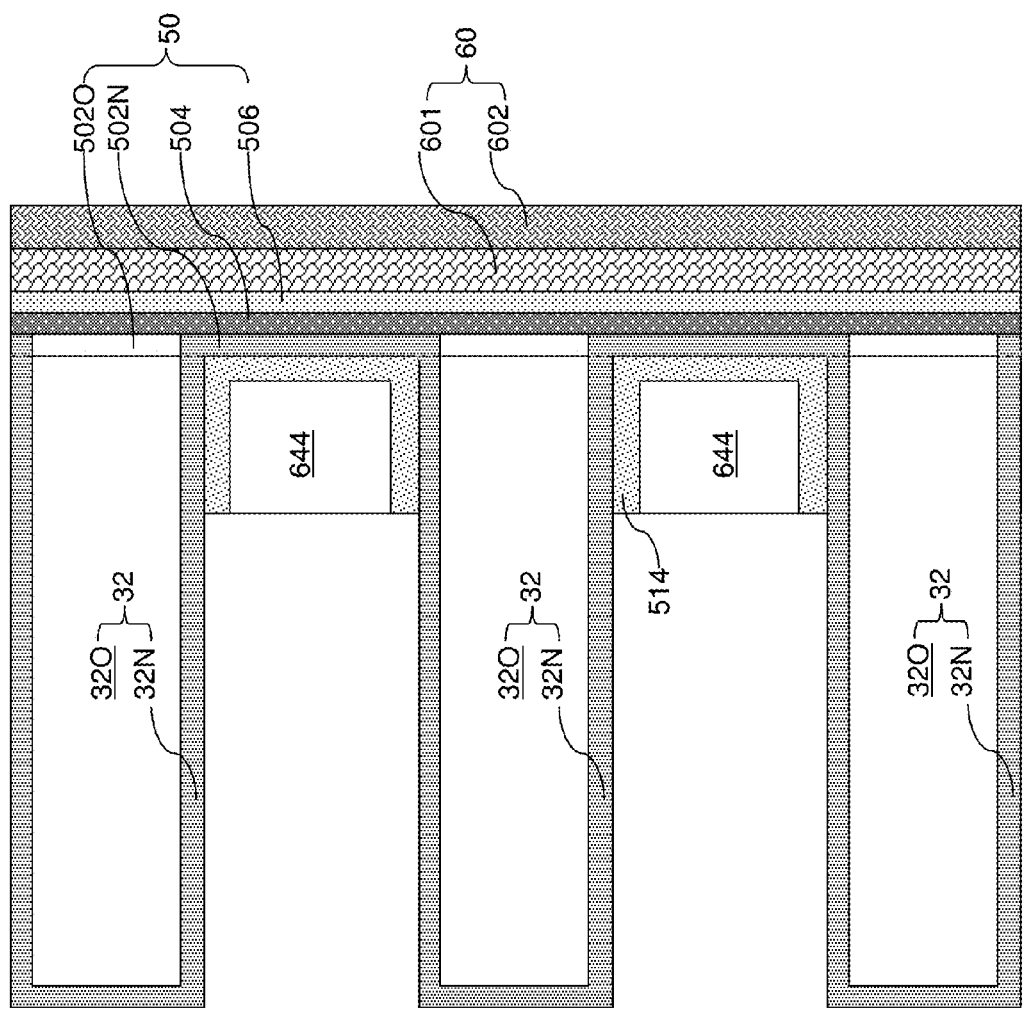

Referring to FIG. 14E, the processing steps of FIG. 13E can be optionally performed to anneal the backside blocking dielectric portions 614 in case the backside blocking dielectric portions 614 comprise an amorphous dielectric metal oxide. A set of backside blocking dielectric portions 514 can be formed in proximity to the memory stack structures 55.

Referring to FIG. 14F, the processing steps of FIG. 13F can be formed to remove the sacrificial fill material portions 644 selective to the set of backside blocking dielectric portions 514.

Figure 14G:
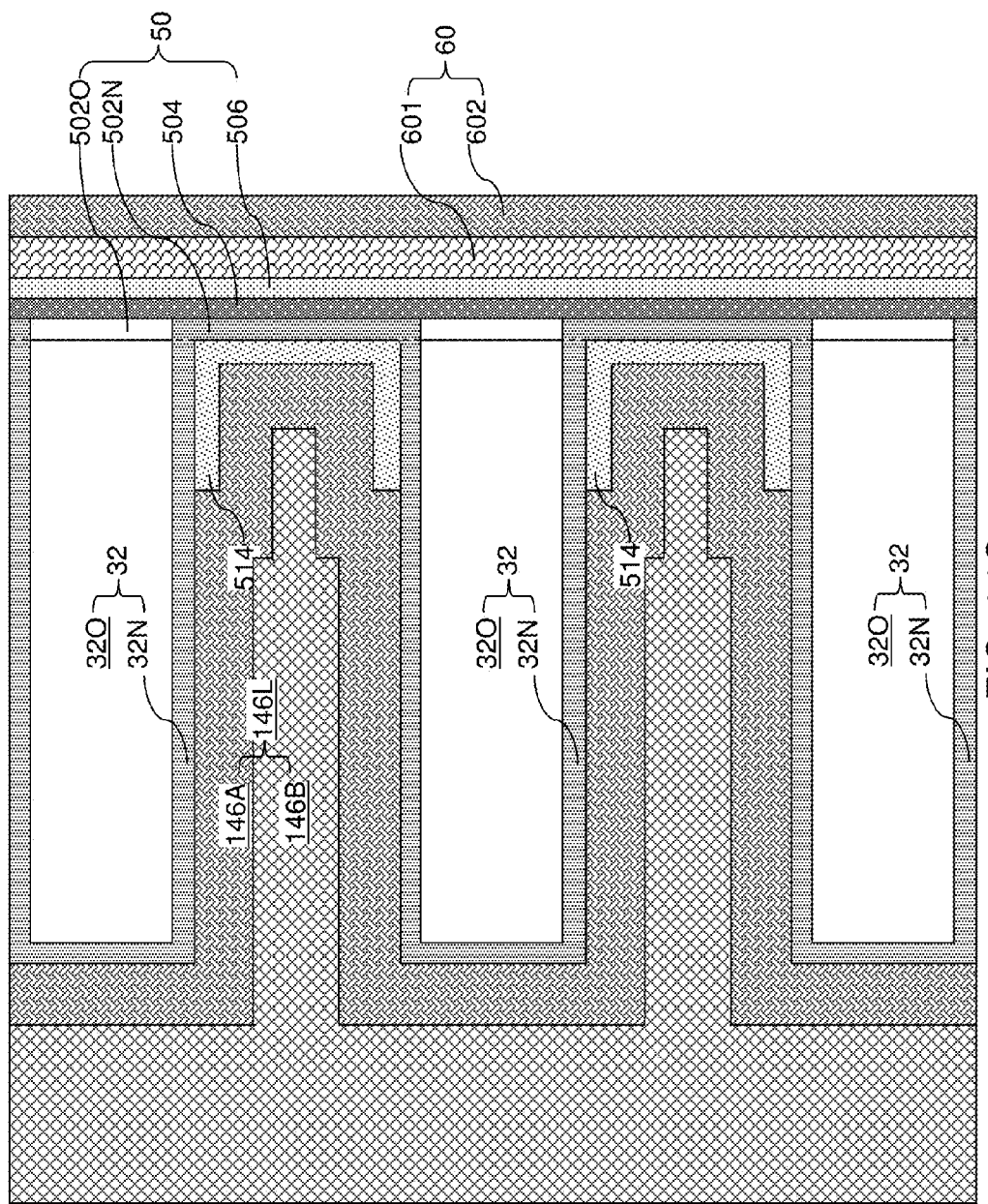

Referring to FIG. 14G, the processing steps of FIG. 7D or FIG. 14G can be performed to deposit at least one metallic material in the plurality of backside recesses 43, and to form a contiguous conductive material layer 146L. The contiguous conductive material layer 146L can comprise a layer stack of a metallic liner layer 146A and a metallic fill material layer 146B as in the first embodiment. In one embodiment, the at least one metallic material can be deposited employing at least one fluorine-containing precursor gas as a precursor gas during the deposition process.

Figure 14H:
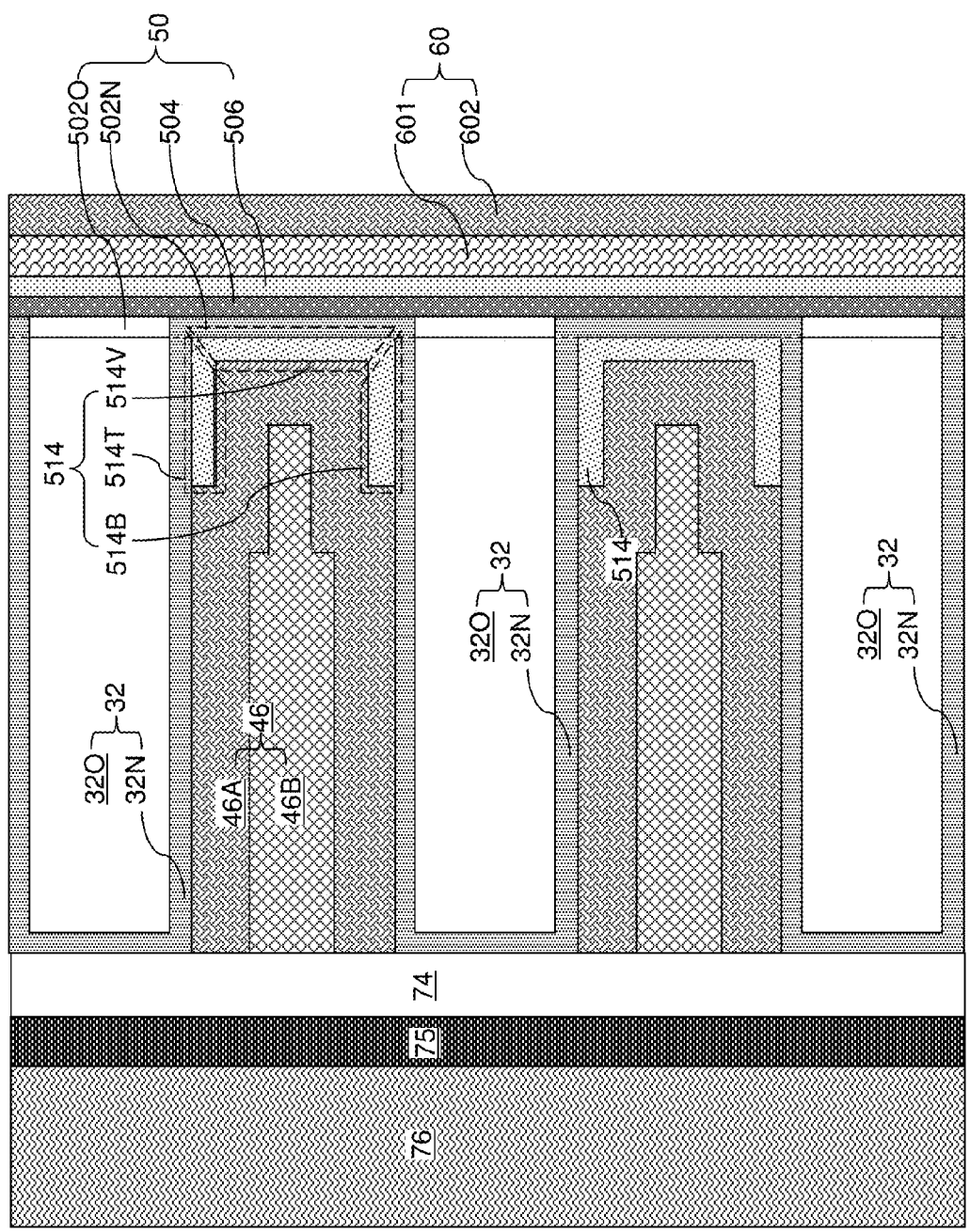

Referring to FIG. 14H, the processing steps of FIGS. 9, 10, and 11 are sequentially performed to form electrically conductive layers 46 that fill each remaining volume of backside cavities 43. Each backside cavity is filled with a combination of a blocking dielectric material portion 514 and an electrically conductive layer 46. Each electrically conductive layer 46 can include a metallic liner layer 46A and a metallic fill material layer 46B.

The silicon oxynitride layers 32N and the silicon oxynitride portions 502N can retard, or prevent, diffusion of fluorine atoms that may be present in the electrically conductive layers 46. Further, the set of blocking dielectric material portion 514 can retard, or prevent, diffusion of fluorine atoms that may be present in the electrically conductive layers 46. The silicon oxynitride layers 32N and the silicon oxynitride portions 502N

The third exemplary structure can comprise a monolithic three-dimensional memory device. The monolithic three-dimensional memory device can comprise a stack of alternating layers comprising insulating layers 32 and electrically conductive layers 46 and located over a substrate (9, 10), a memory opening 49 extending vertically through the stack (32, 42), a memory film 50 and a semiconductor channel 60 located within the memory opening 49, and a set of blocking dielectric material portions 514 interposed between the memory film 50 and each of the electrically conductive layers 46 (which can be embodied as multiple laterally separated portions). Each of the blocking dielectric material portions in the set can comprises a vertical portion 514V contacting a sidewall of a respective electrically conductive layer 46, a top horizontal portion 514T extending outward from the memory opening 49 and contacting a top surface of the respective electrically conductive layer 46, and a bottom horizontal portion 514B extending outward from the memory opening 49 and contacting a bottom surface of the respective electrically conductive layer 46. Each blocking dielectric material portion 514 within the set of blocking dielectric material portion 514 can be laterally spaced from the backside contact trench 79 by a same lateral distance. The top and bottom horizontal portions 515T, 514B of each blocking dielectric material portion 514 can contact the respective silicon oxynitride layers 32N, while the vertical portion 514V can contact the silicon oxynitride portions 502N.

The memory film 50 comprises a blocking dielectric layer (502O, 502N) having a first compositional modulation along a vertical direction. In one embodiment, the first compositional modulation comprises a modulation in atomic concentration of nitrogen atoms and oxygen atoms in the oxide 32, and the atomic concentration of nitrogen in the blocking dielectric layer (502O, 502N) decreases as a function of distance from the electrically conductive layers 46 in portions of the blocking dielectric layer (502O, 502N), i.e., in the silicon oxynitride portions 502N. In one embodiment, the first compositional modulation further comprises a modulation in atomic concentration of oxygen atoms, and the atomic concentration of oxygen atoms in the blocking dielectric layer (502O, 502N) increases as a function of distance from the electrically conductive layers 46 in portions of the blocking dielectric layer (502O, 502N), i.e., in the silicon oxynitride portions 502N. In one embodiment, the blocking dielectric layer (502O, 502N) can have the same thickness throughout. In one embodiment, blocking dielectric layer (502O, 502N) comprises an alternating stack of silicon oxide portions 502O and silicon oxynitride portions 502N. The silicon oxide portions 502O are located at same levels as respective insulating layers 32 and silicon oxynitride portions 502N are located at same levels as the electrically conductive layers 46. As used herein, a "level" refers to the height (i.e., distance in the vertical direction) from the top surface 7 of the substrate.

In one embodiment, each insulating layer 32 can have a second compositional variation as a function of distance from an interface with an overlying or underlying electrically conductive layer 46 up to a surface layer thickness, which is the same as the thickness of a respective silicon oxynitride layer 32N. Each electrically conductive layer 46 can include a metallic liner layer 46A and a metallic fill material layer 46B. The silicon oxynitride layers 32N and the silicon oxynitride portions 502N can retard, or prevent, diffusion of fluorine atoms that may be present in the electrically conductive layers 46.

Each of the first, second, and third exemplary structures can comprise a monolithic three-dimensional memory device. The monolithic three-dimensional memory device can comprise a vertical NAND device located over the substrate (9, 10). The electrically conductive layers 46 can comprise, or can be electrically connected to, a respective word line of the NAND device. The substrate (9, 10) can comprise a silicon substrate. In one embodiment, the vertical NAND device can comprise an array of monolithic three-dimensional NAND strings over the silicon substrate. In one embodiment, at least one memory cell in a first device level of the array of monolithic three-dimensional NAND strings can be located over another memory cell in a second device level of the array of monolithic three-dimensional NAND strings. In one embodiment, the silicon substrate can contain an integrated circuit comprising a driver circuit for the memory device located thereon.

In one embodiment, the array of monolithic three-dimensional NAND strings comprises a plurality of semiconductor channels extending between a source region 61 and a plurality of drain regions 63. At least one end portion of each of the plurality of semiconductor channels extends substantially perpendicular to a top surface of the substrate (9, 10). The array of monolithic three-dimensional NAND strings comprises a plurality of charge storage elements. Each charge storage element can be located adjacent to a respective one of the plurality of semiconductor channels. The array of monolithic three-dimensional NAND strings comprises a plurality of control gate electrodes having a strip shape extending substantially parallel to the top surface of the substrate. The plurality of control gate electrodes comprises at least a first control gate electrode located in the first device level and a second control gate electrode located in the second device level.

The various embodiments of the present disclosure can be employed to reduce or stop diffusion of fluorine atoms from the metallic material of the metallic fill material layer 146B (such as tungsten) to the insulating layers 32. In some embodiments, a blocking dielectric material portion 514 and a metallic liner layer 146A can be provided between each neighboring pair of a metallic fill material layer 146B and an insulating layer 32. According to some embodiments of the present disclosure, fluorine diffusion can be retarded or eliminated by making the surface portions of the insulating layer 32 more resistant to fluorine diffusion, for example, by converting surface portions of the insulating layers 32 into a silicon oxynitride layer 32N. For example, after removal of sacrificial material layers 42, in-situ steam generation anneal process may be employed to densify at least surface portions of the insulating layers 32. A nitridation process may subsequently performed to form a silicon oxynitride layer 32N. The combination of the densification anneal and formation of the silicon oxynitride layer 32N makes the insulating layers 32 more robust against fluorine diffusion, i.e., causes the insulating layers 32 to become more resistant to fluorine diffusion. Thus, the insulating layers 32 can become more resistant to fluorine diffusion without increasing the thickness of the metallic liner layer 146A (which can be, for example, a TiN layer) or the thickness of the blocking dielectric material portion 514.

Alternatively or additionally, the thickness of the metallic liner layer 146A can be increased without reducing the thickness of the metallic fill material layers 146B according to some embodiments of the present disclosure. This can be achieved by partially removing outer portions of a blocking dielectric layer in regions proximal to a backside contact trench, while retaining the blocking dielectric material portions 514 that are proximal to memory stack structures. Partial removal of the blocking dielectric layer provides more available volume for the combination of the metallic liner layer 146A and the metallic fill material layer 146B. In this case, the thickness of the metallic liner layer 146A can be increased by removing the portions of the blocking dielectric layer in proximity to the backside contact trench and filling the space previously occupied by the blocking dielectric with the metallic liner layer 146A (e.g., metal nitride barrier layer) without reducing the thickness of layer 146 (e.g., tungsten layer).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
    a stack of alternating layers comprising insulating layers and electrically conductive layers and located over a substrate;
    a memory opening extending vertically through the stack; and
    a memory film and a semiconductor channel located within the memory opening, the memory film comprising a blocking dielectric which comprises an alternating stack of silicon oxide portions and silicon oxynitride portions.

2. The monolithic three-dimensional memory device of claim 1, wherein:
    the silicon oxide portions are located at same levels as respective insulating layers in the stack; and
    the silicon oxynitride portions are located at same levels as the electrically conductive layers in the stack.

3. The monolithic three-dimensional memory device of claim 2, wherein:
    an atomic concentration of nitrogen in the blocking dielectric decreases as a function of distance from the electrically conductive layers in portions of the blocking dielectric; and
    an atomic concentration of oxygen atoms in the blocking dielectric increases as a function of distance from the electrically conductive layers in portions of the blocking dielectric.

4. The monolithic three-dimensional memory device of claim 1, wherein the blocking dielectric has a same thickness throughout its height, and wherein a compositional gradient is present in regions of the silicon oxide portions that adjoin the insulating layers.

5. The monolithic three-dimensional memory device of claim 1, wherein:
    each insulating layer comprises an inner silicon oxide layer covered by a respective outer silicon oxynitride layer;
    the outer silicon oxynitride layer and the silicon oxynitride portions together form a continuous silicon oxynitride region;
    the silicon oxynitride portions form first vertical portions of the continuous silicon oxynitride region;
    the outer silicon oxynitride layers form second vertical portions and horizontal portions of the continuous silicon oxynitride region; and
    each horizontal portion connects a pair of adjacent, laterally offset first and second vertical portions.

6. The monolithic three-dimensional memory device of claim 5, further comprising:
    a set of metal oxide blocking dielectric material portions interposed between the memory film and each of the electrically conductive layers, wherein each of the metal oxide blocking dielectric material portions comprises:
    a vertical portion contacting a sidewall of a respective electrically conductive layer and a sidewall respective silicon oxynitride portion;
    a top horizontal portion extending outward from the memory opening and contacting a top surface of the respective electrically conductive layer and a bottom surface of a respective silicon oxynitride layer; and
    a bottom horizontal portion extending outward from the memory opening and contacting a bottom surface of the respective electrically conductive layer and a top surface of another respective silicon oxynitride layer.

7. The monolithic three-dimensional memory device of claim 1, wherein:
    the monolithic three-dimensional memory device comprises a vertical NAND device located over the substrate;
    the electrically conductive layers comprise, or are electrically connected to, a respective word line of the NAND device;
    the substrate comprises a silicon substrate;
    the vertical NAND device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon; and
    the array of monolithic three-dimensional NAND strings comprises:
    a plurality of semiconductor channels, wherein at least one end portion of each of the plurality of semiconductor channels extends substantially perpendicular to a top surface of the substrate;
    a plurality of charge storage elements, each charge storage element located adjacent to a respective one of the plurality of semiconductor channels; and
    a plurality of control gate electrodes having a strip shape extending substantially parallel to the top surface of the substrate, the plurality of control gate electrodes comprise at least a first control gate electrode located in the first device level and a second control gate electrode located in the second device level.

8. A monolithic three-dimensional memory device comprising:
- a stack of alternating layers comprising insulating layers and electrically conductive layers and located over a substrate;
- a first memory opening extending vertically through the stack;
- a first memory film and a first semiconductor channel located within the first memory opening; and
- a set of metal oxide blocking dielectric material portions interposed between the first memory film and each of the electrically conductive layers, wherein each of the metal oxide blocking dielectric material portions in the set comprises:
  - a vertical portion contacting a sidewall of a respective electrically conductive layer;
  - a top horizontal portion extending outward from the first memory opening and contacting only a portion of a top surface of the respective electrically conductive layer; and
  - a bottom horizontal portion extending outward from the first memory opening and contacting only a portion of a bottom surface of the respective electrically conductive layer.

9. The monolithic three-dimensional memory device of claim 8, wherein:
- a top surface of the top horizontal portion is coplanar with a topmost surface of the respective electrically conductive layer;
- a bottom surface of the bottom horizontal portion is coplanar with a bottommost surface of the respective electrically conductive layer; and
- the set of metal oxide blocking dielectric material portions comprises polycrystalline aluminum oxide material.

10. The monolithic three-dimensional memory device of claim 8, further comprising:
- a trench extending through the stack of alternating layers;
- an insulating spacer located at a periphery of the trench; and
- a contact via structure contacting a portion of the substrate and located within the insulating spacer;
- wherein each metal oxide blocking dielectric material portion within the set is laterally spaced from the trench by a same lateral distance.

11. The monolithic three-dimensional memory device of claim 10, further comprising:
- a second memory opening extending vertically through the stack and laterally spaced from the trench by a different distance than the first memory opening is from the trench; and
- a second memory film and a second semiconductor channel located within the second memory opening.

12. The monolithic three-dimensional memory device of claim 8, wherein:
- the first memory film further comprises a blocking dielectric extending through the stack of alternating layers;
- the blocking dielectric comprises an alternating stack of silicon oxide portions and silicon oxynitride portions;
- the silicon oxide portions contact respective insulating layers; and
- the silicon oxynitride portions contact respective metal oxide blocking dielectric material portions.

13. The monolithic three-dimensional memory device of claim 8, wherein:
- the monolithic three-dimensional memory device comprises a vertical NAND device located over the substrate;
- the electrically conductive layers comprise, or are electrically connected to, a respective word line of the NAND device;
- the substrate comprises a silicon substrate;
- the vertical NAND device comprises an array of monolithic three-dimensional NAND strings over the silicon substrate;
- at least one memory cell in a first device level of the array of monolithic three-dimensional NAND strings is located over another memory cell in a second device level of the array of monolithic three-dimensional NAND strings;
- the silicon substrate contains an integrated circuit comprising a driver circuit for the memory device located thereon; and
- the array of monolithic three-dimensional NAND strings comprises:
  - a plurality of semiconductor channels, wherein at least one end portion of each of the plurality of semiconductor channels extends substantially perpendicular to a top surface of the substrate;
  - a plurality of charge storage elements, each charge storage element located adjacent to a respective one of the plurality of semiconductor channels; and
  - a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *